(12) United States Patent
Kobayashi et al.

(10) Patent No.: US 10,219,404 B2
(45) Date of Patent: Feb. 26, 2019

(54) DOUBLE FLOOR MEMBER

(71) Applicant: SENQCIA CORPORATION, Tokyo (JP)

(72) Inventors: Atsuhiko Kobayashi, Tokyo (JP); Katsura Maruyama, Aichi (JP)

(73) Assignee: SENQCIA CORPORATION, Tokyo (JP)

( * ) Notice: Subject to any disclaimer, the term of this patent is extended or adjusted under 35 U.S.C. 154(b) by 0 days.

(21) Appl. No.: 15/532,164

(22) PCT Filed: Dec. 1, 2014

(86) PCT No.: PCT/JP2014/081799
§ 371 (c)(1),
(2) Date: Jun. 1, 2017

(87) PCT Pub. No.: WO2016/088184
PCT Pub. Date: Jun. 9, 2016

(65) Prior Publication Data
US 2017/0268239 A1    Sep. 21, 2017

(51) Int. Cl.
*H05K 7/14* (2006.01)
*E04F 15/024* (2006.01)

(52) U.S. Cl.
CPC ..... *H05K 7/1497* (2013.01); *E04F 15/02405* (2013.01)

(58) Field of Classification Search
CPC .......... E04F 15/02458; E04F 15/02447; E04F 15/0247; E04F 15/02405; H05K 7/1497
See application file for complete search history.

(56) References Cited

U.S. PATENT DOCUMENTS

| 8,434,275 | B2 * | 5/2013 | Hashimoto | ....... E04F 15/02452 52/126.6 |
| 2006/0080908 | A1 * | 4/2006 | Peng | .......................... E04H 9/02 52/167.5 |
| 2009/0229194 | A1 * | 9/2009 | Armillas | ................ E04H 1/1205 52/79.1 |
| 2011/0023387 | A1 * | 2/2011 | Sweeney | .................. E04H 9/021 52/167.4 |

FOREIGN PATENT DOCUMENTS

| JP | H05043154 | | 10/1993 |
| JP | 2003221924 | A | 8/2003 |
| JP | 2005042411 | A | 2/2005 |
| JP | 2007198026 | A | 8/2007 |
| JP | 2007277884 | A | * 10/2007 |
| JP | 2011069542 | A | 9/2009 |
| JP | 2010261176 | A | 11/2010 |

* cited by examiner

*Primary Examiner* — Joshua K Ihezie
(74) *Attorney, Agent, or Firm* — Bacon & Thomas, PLLC

(57) ABSTRACT

A double-floor member includes at least one first guide rail (24) that is fixed to an upper surface and at least one first connecting member (27) that is movable in the longitudinal direction of the first guide rail (24) and is engaged with the first guide rail (24) so as not to be separated upward from the first guide rail (24).

15 Claims, 37 Drawing Sheets

DOUBLE FLOOR MEMBER

TECHNICAL FIELD

The present invention relates to a double-floor member, such as a floor panel or a frame, installed in a free access floor laid on a floor portion of a room such as a data center in which IT devices such as servers are received.

BACKGROUND ART

In recent years, a large amount of data has been handled by IT devices such as servers as a sophisticated information society comes. For this reason, there are many cases in which a lot of IT devices are installed in a data center, a server room, or the like and are collectively managed.

FIGS. 35 to 37 are views illustrating a data center 1 in the related art. As illustrated in FIGS. 35 and 36, a free access floor 12 having a double-floor structure is formed on a floor portion of a room of the data center 1 and a plurality of floor panels 3 are laid so as to form the floor face of the free access floor 12 (for example, see Patent Document 1).

As illustrated in FIG. 36, the floor panels 3 are horizontally supported at a predetermined height by support legs 7 standing on a concrete foundation floor face 5 and are laid side by side so as to form the floor face of the room of the data center 1. Accordingly, pipes and wires are provided in a space between the floor panels 3 and the foundation floor face 5 that is present below the floor panels 3.

Further, a frame 2 standing on the foundation floor face 5 is disposed at a place where the floor panels 3 are not laid in the data center 1, and a plurality of server racks 10 on which servers are mounted on racks of the respective stages are placed side by side on the frame 2 so as to be adjacent to each other (for example, see Patent Document 2).

The frame 2 is formed of a combination of a plurality of L-shaped steel members (angle members 4) and a plate-like steel sheet (upper plate member 6), and is produced so as to have the same height as the floor face of the free access floor 12 (the upper surface of the floor panel 3) and so as to correspond to the sizes (width and depth) of the server racks 10. Furthermore, leg parts of the frame 2 are fixed to the foundation floor face 5 by anchor bolts 11.

Moreover, male screw portions of fixing bolts 8 are inserted into through-holes that are formed in each of a bottom plate portion 10a forming the bottom of the server rack 10 and the upper plate member 6 forming the upper surface of the frame 2.

Further, the lower surface of a head portion of the fixing bolt 8 is engaged with the upper surface of the bottom plate portion 10a of the server rack 10, and the upper surface (the upper surface in FIG. 36) of a fixing nut 9 fastened to the tip portion of the male screw portion of the fixing bolt 8 is engaged with the lower surface of the upper plate member 6.

The server racks 10 and the frame 2 are connected to each other by the fixing bolts 8 and the fixing nuts 9 as described above so that the server racks 10 are not separated upward from the upper surface of the frame 2 and do not fall down.

Since the server racks 10 are disposed on the frame 2, the floor panels 3 do not receive the load of the server racks 10 and the load of the server racks 10 can be directly applied to the foundation floor face 5 through the frame 2. Accordingly, it is possible to improve a load bearing property about the load of the server rack 10 in comparison with a case in which the server racks 10 are placed on the upper surfaces of the floor panels 3.

In addition, since the server racks 10 are disposed on the frame 2, it is possible to prevent the server racks 10 from falling down at the time of the occurrence of an earthquake or the like and to improve the levelness of the server rack 10 in comparison with a case in which the server racks 10 are placed on the floor panels 3.

CITATION LIST

Patent Document

Patent Document 1: JP 2011-069542 A
Patent Document 2: JP 2003-221924 A

SUMMARY OF THE INVENTION

Problem to be Solved by the Invention

However, since the sizes (width and depth) of the server rack 10 vary for each product in the data center 1 in the related art, the positions of through-holes, which are formed in the bottom plate portion 10a of the server rack 10 and are used to connect the server rack to the frame 2 in order to prevent the server rack 10 from falling down, also vary for each product.

For this reason, a plurality of through-holes 2a, which are used to connect the server rack 10, need to be formed in the upper plate member 6 of the frame 2 in advance as illustrated in FIG. 37 while assuming the horizontal positions of the through-holes formed in the bottom plate portion 10a of the server rack 10.

Further, when it is assumed that the horizontal positions of the through-holes formed in the bottom plate portion 10a of the server rack 10 are disposed at the peripheral portion of the upper plate member 6 supported by the angle members 4, the plurality of through-holes 2a, which are used to connect the server rack 10, need to be formed in advance so as to pass through both the upper plate member 6 and the angle members 4.

Furthermore, whenever the through-holes formed in the bottom plate portion 10a of the server rack 10 are formed at positions that are not assumed in advance, the plurality of through-holes 2a, which are used to connect the server rack 10, need to be formed in the upper plate member 6 of the frame 2 or both the upper plate member 6 and the angle members 4.

Since the through-holes 2a need to be formed in the frame 2 according to various types of server racks 10 as described above, there are problems in that the cost required for the work for the installation of the server rack 10 increases and construction efficiency is reduced.

Accordingly, the invention has been made in consideration of the abovementioned problems and an object of the invention is to provide a double-floor member that can prevent an increase in the cost required for work for the installation of a server rack and prevent the reduction of construction efficiency.

Means for Solving Problem

In order to achieve the object, a double-floor member according to the invention includes at least one first guide rail that is fixed to an upper surface and at least one first connecting members that is movable in the longitudinal direction of the first guide rail and is engaged with the first guide rail so as not to be separated upward from the first guide rail.

The double-floor member according to the invention further includes at least one second guide rail that is disposed so as to be bridged between the first guide rail and is connected to the first connecting member engaged with the first guide rail, respectively, and at least one second connecting member that is movable in the longitudinal direction of the second guide rail and is engaged with the second guide rail so as not to be separated upward from the second guide rail.

Furthermore, a double-floor member according to the invention includes at least one groove rail that is formed so as to be recessed from an upper surface toward a lower side of a floor and at least one first connecting member that is movable in the longitudinal direction of the groove rail and is engaged with the groove rail so as not to be separated upward from the groove rail.

The double-floor member according to the invention further includes at least one second guide rail that is disposed so as to be bridged between the groove rail and is connected to the first connecting members engaged with the groove rail, respectively, and at least one second connecting member that is movable in longitudinal direction of the second guide rail and is engaged with the second guide rail so as not to be separated upward from the second guide rail.

Further, in the double-floor member according to the invention, a case-connecting hole is formed in the first connecting member so that the first connecting member can be connected by a fixing bolt.

Furthermore, in the double-floor member according to the invention, a hole is formed in the second connecting member so that the second connecting member can be connected by a fixing bolt.

Moreover, the double-floor member according to the invention is a floor panel.

Further, the double-floor member according to the invention is a frame.

Effect of the Invention

Since the double-floor member according to the invention includes at least one first guide rail that is fixed to an upper surface and at least first connecting member that is movable in the longitudinal direction of the first guide rail and is engaged with the first guide rail so as not to be separated upward from the first guide rail, it is possible to prevent an increase in the cost required for work for the installation of a server rack and to prevent the reduction of construction efficiency.

MODE(S) FOR CARRYING OUT THE INVENTION

Figure 1:
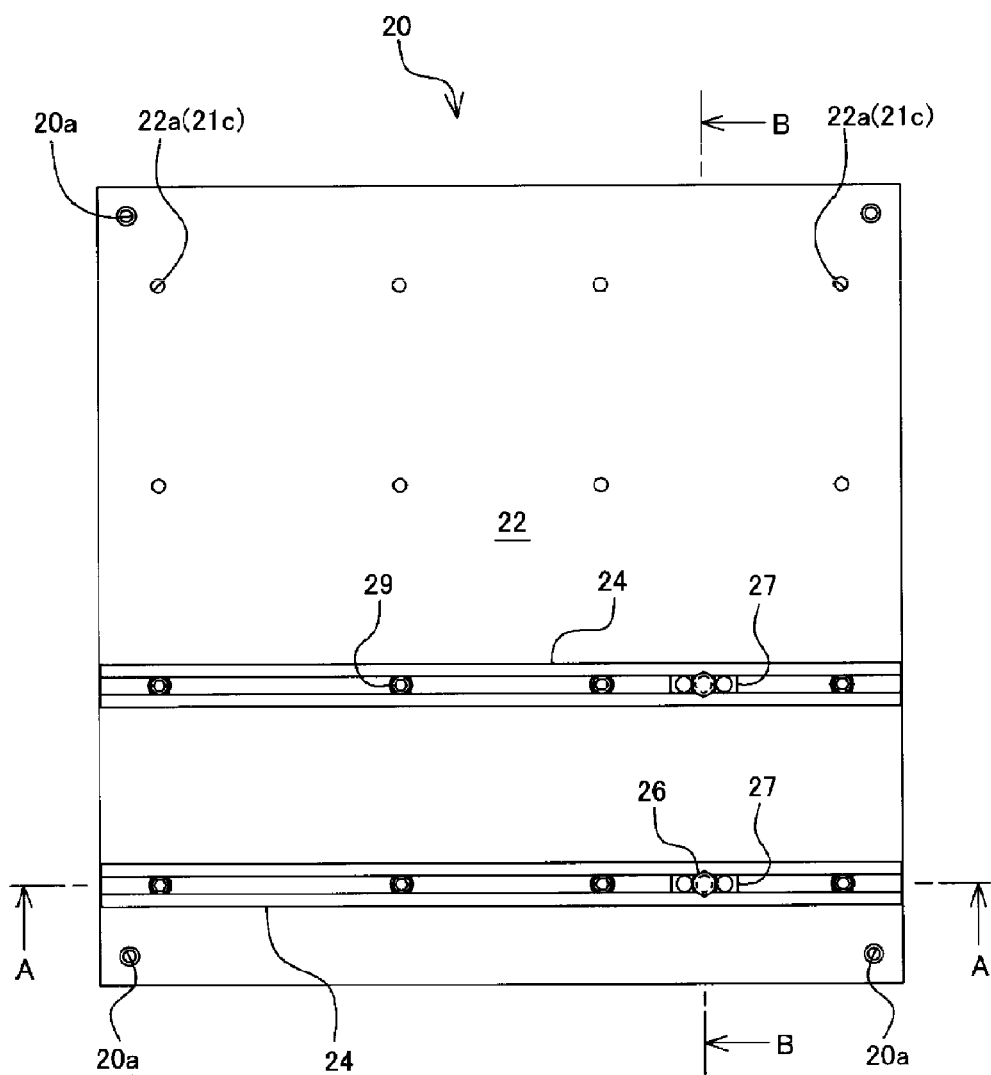
FIG. 1 is a top view of a floor panel 20 according to a first embodiment of the invention.

Double-floor members according to embodiments of the invention will be described below in detail with reference to the drawings. FIGS. 1 to 13 are views illustrating a floor panel 20 (a double-floor member) according to a first embodiment of the invention.

As illustrated in FIGS. 1 to 4, the floor panel 20 according to this embodiment mainly includes a panel body 21, a tile 22 that is attached to the upper surface of the panel body 21, first guide rails 24 that are fixed to the upper surface of the tile 22, slide members 27 (first connecting member) that are disposed so as to be movable in the first guide rails 24 in a longitudinal direction, and the like.

Figure 2:
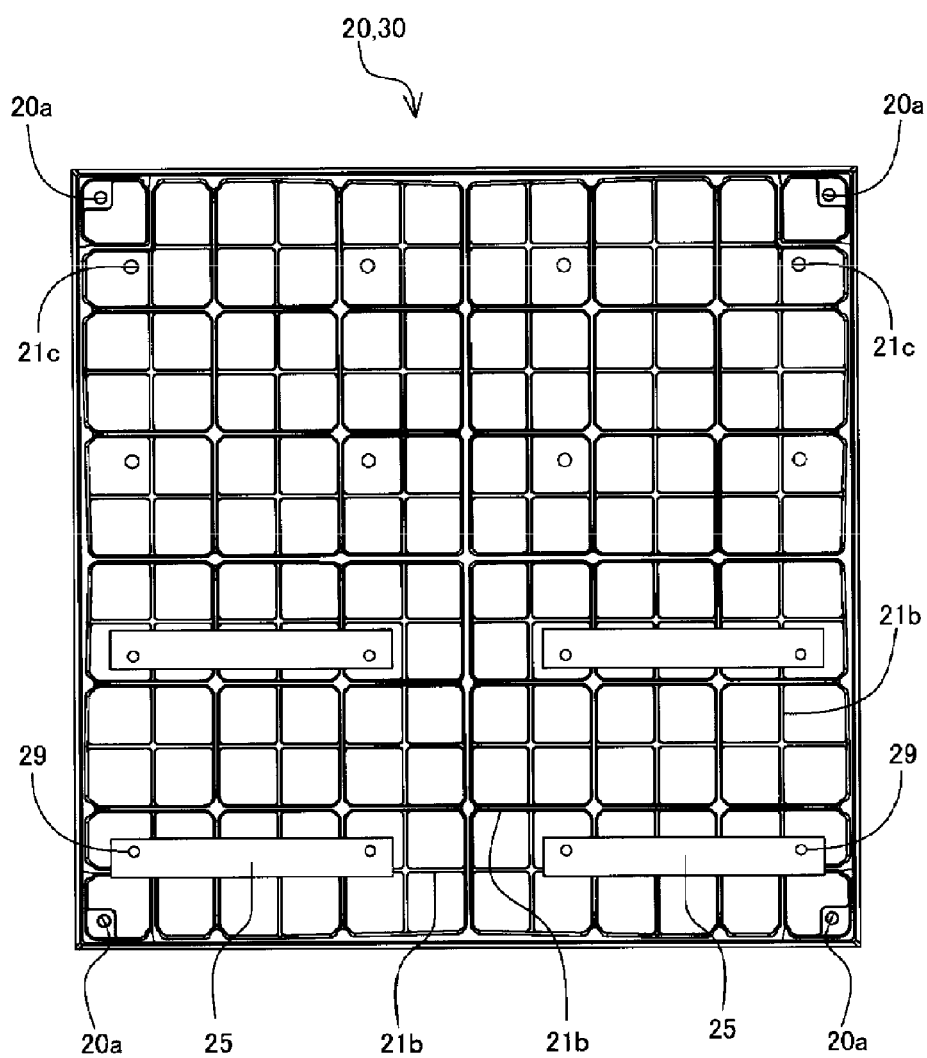
FIG. 2 is a bottom view of the floor panels 20 and 30 illustrated in FIG. 1.
Figure 3:
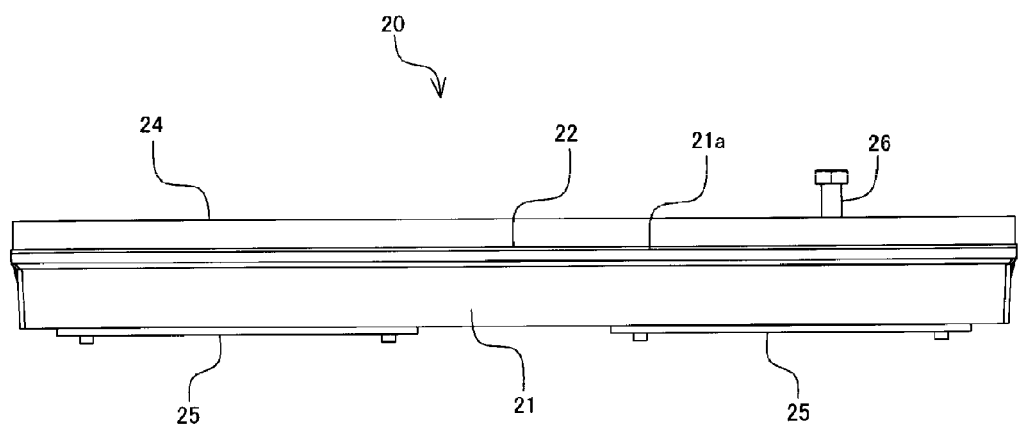
FIG. 3 is a front view of the floor panel 20 illustrated in FIG. 1.
Figure 4:
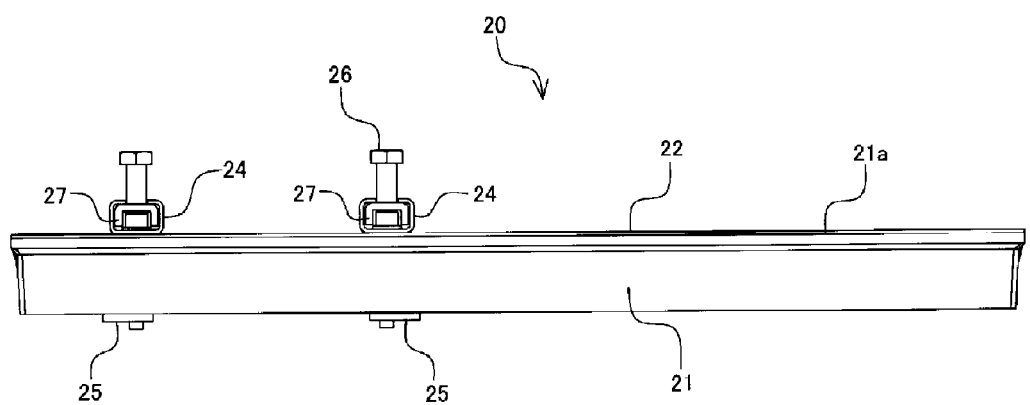
FIG. 4 is a right side view of the floor panel 20 illustrated in FIG. 1.
Figure 5:
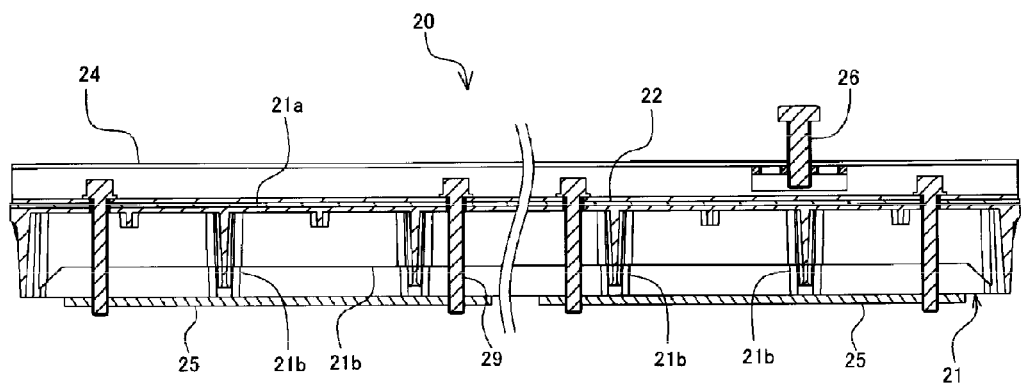
FIG. 5 is a cross-sectional view taken along line A-A from which a part of the floor panel 20 illustrated in FIG. 1 is omitted.

The panel body 21 is a die-cast product that uses an aluminum alloy as a material thereof, and includes a flat plate portion 21a that forms an upper surface of the panel body 21 and a plurality of ribs 21b that are integrally formed on the back surface of the flat plate portion 21a (see FIG. 2).

The plurality of ribs 21b of the panel body 21 protrude from the back surface of the flat plate portion 21a toward the lower side of the floor (in a downward direction in FIGS. 5 and 7), and are formed in a lattice shape so as to extend along the horizontal surface of the flat plate portion 21a in both a longitudinal direction and a lateral direction (a vertical direction and a horizontal direction in FIG. 2). Since the plurality of ribs 21b are formed on the panel body 21, the strength of the panel body 21 is improved.

Further, 16 through-holes 21c, which pass through the flat plate portion 21a in the thickness direction of the flat plate portion 21a (a vertical direction in FIG. 3), are formed side by side at predetermined intervals at positions where the ribs 21b are not formed on the back surface of the flat plate portion 21a of the panel body 21 (see FIGS. 1 and 2).

Furthermore, the tile 22, such as a vinyl chloride-based P-tile or a HPL (high-pressure laminate) tile, is attached to the upper surface of the flat plate portion 21a of the panel body 21. While the tile 22 is attached to the flat plate portion 21a of the panel body 21, outer peripheral portions of the floor panel 20 forming the respective sides are cut together. For this reason, the respective outer peripheral portions of the floor panels 20 are formed with high dimensional accuracy (for example, ±0.1 mm or less).

Further, 16 through-holes 22a, which pass through the tile 22 in the thickness direction of the tile 22 (a vertical direction in FIG. 6), are formed at the positions, which correspond to the through-holes 21c formed in the flat plate portion 21a of the panel body 21, on the tile 22 so as to communicate with the through-holes 21c (see FIG. 1).

Figure 8:
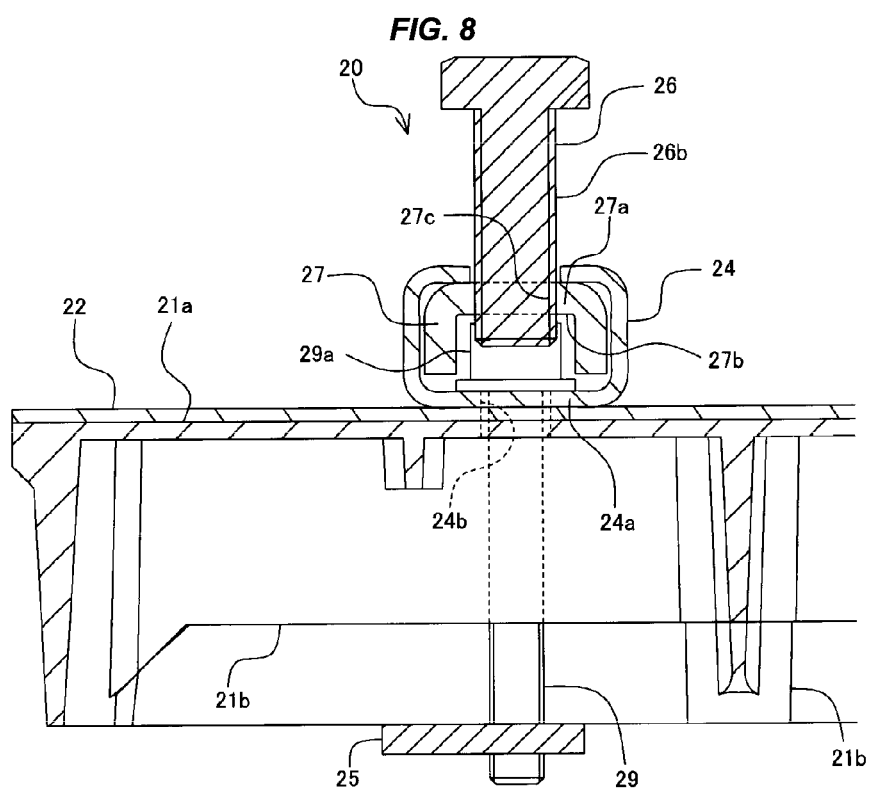
FIG. 8 is a partially enlarged cross-sectional view of a right portion of FIG. 7.

Furthermore, steel or the like is used as the material of each of the first guide rails 24, and each of the first guide rails 24 is formed so as to have a C-shaped cross-sectional shape perpendicular to the longitudinal direction thereof (see FIG. 8). A bottom plate portion 24a opposite to an opening of the C-shaped first guide rail comes into contact with and is fixed to the upper surface of the tile 22 so that the opening of the C-shaped first guide rail 24 faces the upper side (the C shape is rotated in a counterclockwise direction by 90°).

Moreover, as illustrated in FIG. 1, two first guide rails 24 are disposed on the upper surface of the tile 22 to extend in the horizontal direction in FIG. 1 to a substantially left end portion of the upper surface of the tile 22 from a substantially right end portion thereof in FIG. 1 so that the longitudinal directions of the two first guide rails 24 are parallel to each other.

Further, through-holes 24b, which pass through the bottom plate portion 24a in the thickness direction of the bottom plate portion 24a, are formed in the bottom plate portion 24a (see FIGS. 6 and 8) of each of the first guide rails 24 that comes into contact with the upper surface of the tile 22. The first guide rails 24 are disposed so that the through-holes 24b communicate with the through-holes 21c of the panel body 21 and the through-holes 22a of the tile 22.

Figure 6:
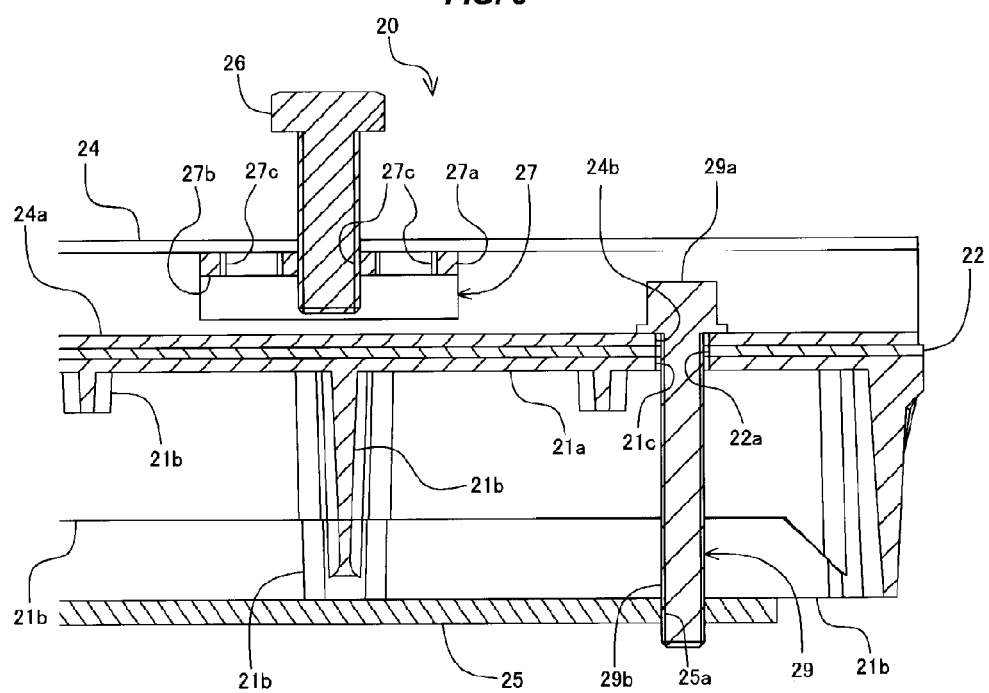
FIG. 6 is a partially enlarged cross-sectional view of a right portion of FIG. 5.
Figure 7:
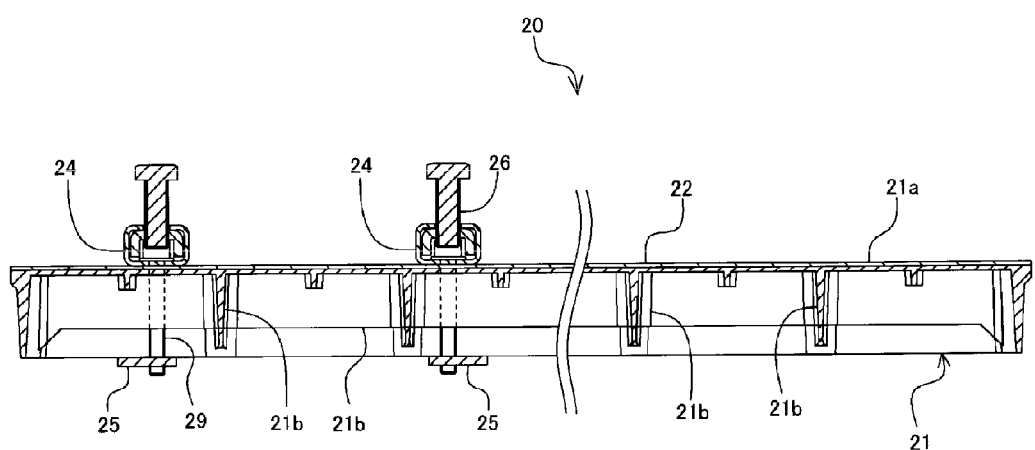
FIG. 7 is a cross-sectional view taken along line B-B from which a part of the floor panel 20 illustrated in FIG. 1 is omitted.

Furthermore, as illustrated in FIG. 6, the lower surfaces of head portions 29a of bolts 29 come into contact with and are engaged with the upper surface of the inner peripheral portion of the bottom plate portion 24a of the first guide rail 24, and male screw portions 29b of the bolts 29 are inserted into the through-holes 24b of the first guide rail 24, the through-holes 22a of the tile 22, and the through-holes 21c of the panel body 21.

Moreover, flat plate members 25 are disposed at the tip portions of the longest ribs 21b, which protrude from the back surface of the flat plate portion 21a toward the lower side of the floor (in a downward direction in FIG. 6), among the plurality of ribs 21b of the panel body 21 so that the upper surfaces of the flat plate members 25 come into contact with the tip portions of the longest ribs. Female screw holes 25a, which pass through the plate member 25 in a thickness direction (a vertical direction in FIG. 6), are formed in each plate member 25.

Further, a tip portion of the male screw portion 29b of the bolt 29, which is inserted into the through-hole 24b of the first guide rail 24, the through-hole 22a of the tile 22, and the through-hole 21c of the panel body 21 and protrudes downward in FIG. 6, is fastened to the female screw hole 25a of the plate member 25.

Since the lower surfaces of the head portions 29a of the bolts 29 are engaged with the upper surface of the bottom plate portion 24a of the first guide rail 24 and the upper surface of the plate member 25 fastened to the tip portion of the male screw portion 29b of the bolt 29 is engaged with the lower surfaces of the ribs 21b of the panel body 21 as described above, the first guide rail 24 is fixed to the tile 22 so as not to be separated upward from the upper surface of the tile 22.

Further, steel or the like is used as the material of each of the slide members 27, and each of the slide members 27 is formed so as to have a U-shaped cross-sectional shape perpendicular to the longitudinal direction thereof (see FIG. 8). Each of the slide members 27 is disposed in the first guide rail 24 in an inverted U-shape so that an opening of the U-shaped slide member faces the lower side in FIG. 8.

Furthermore, each of the slide members 27 is formed so that the height position of a lower surface 27b (see FIGS. 6 and 8) of an upper plate portion 27a opposite to the opening of the U-shaped slide member 27 is higher than the height position of the upper surface of the head portion 29a of the bolt 29.

In addition, the slide member 27 is formed so that the width (the length in the horizontal direction in FIG. 8) of the opening of the U-shaped slide member 27 is larger than the diameter (the length in the horizontal direction in FIG. 8) of the head portion 29a of the bolt 29.

For this reason, when the slide member 27 is moved in the longitudinal direction of the first guide rail 24, the slide member 27 can be freely moved from the right end portion of the first guide rail 24 in FIG. 1 to the left end portion thereof in FIG. 1 without coming into contact with the head portion 29a of the bolt 29.

Further, the width (the length in the horizontal direction in FIG. 8) of the upper plate portion 27a of the slide member 27 is larger than the width (the length in the horizontal direction in FIG. 8) of the opening of the first guide rail 24 opened to the upper side.

For this reason, the upward movement of the slide member 27 in FIG. 8 is limited by the engagement between the slide member 27 and the first guide rail 24. Accordingly, the slide member 27 is formed so as not to get out of (be separated from) the first guide rail 24 through the opening of the first guide rail 24 even when the slide member 27 is pulled upward in FIG. 8.

Furthermore, three female screw holes 27c, which pass through the upper plate portion 27a in a thickness direction of the upper plate portion 27a (a vertical direction in FIG. 8), are formed in the upper plate portion 27a of the slide member 27 so as to be adjacent to each other in the longitudinal direction of the slide member 27 (a horizontal direction in FIG. 6).

Further, as illustrated in FIG. 8, the three female screw holes 27c of the upper plate portion 27a of the slide member 27 are adapted so that a male screw portion 26b of a fixing bolt 26, which is inserted through the opening of the first guide rail 24 opened to the upper side in FIG. 8, can be fastened to the female screw hole 27c.

Figure 9:
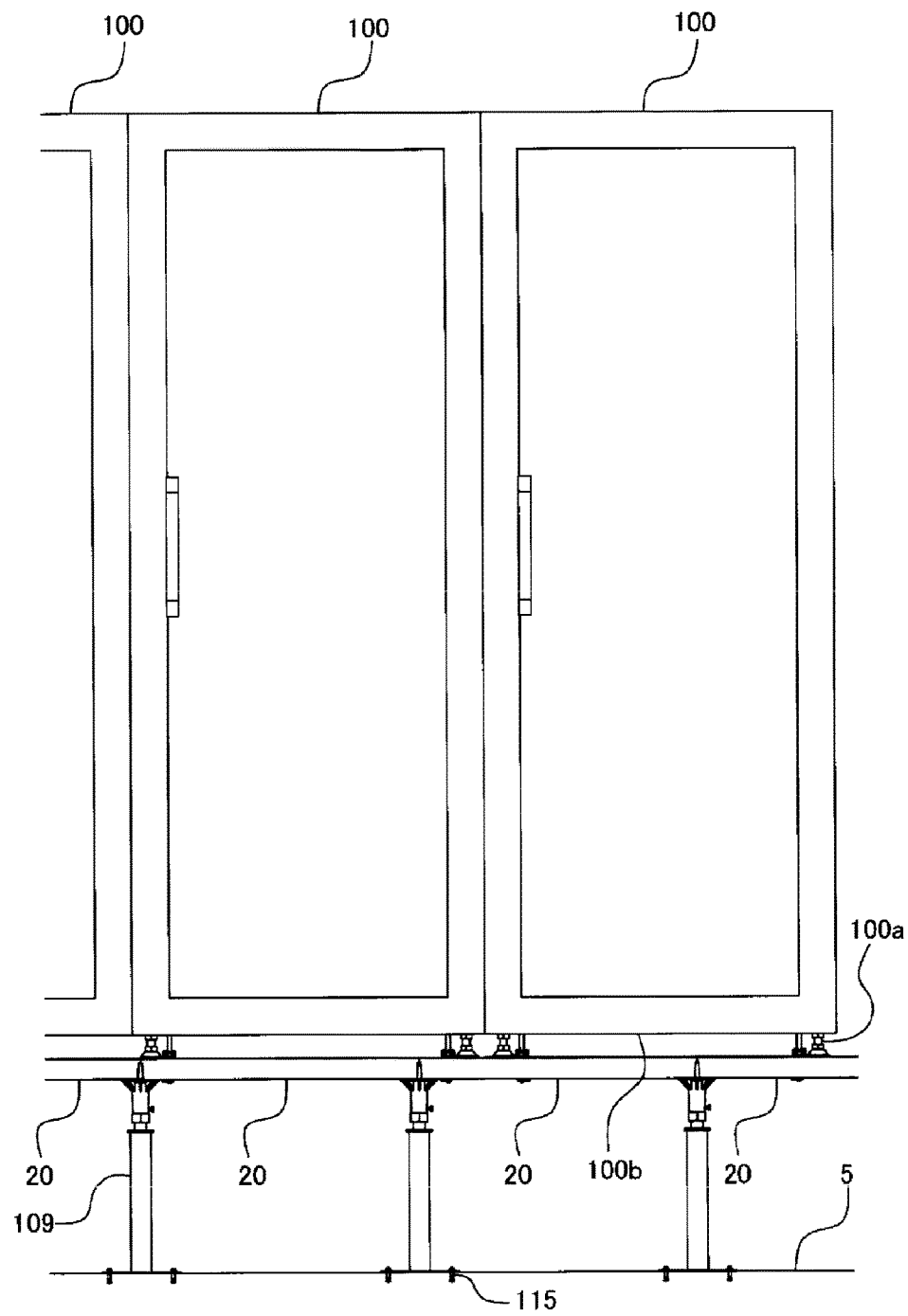
FIG. 9 is a front view of server racks 100 that are installed on the upper surface of the floor panel 20 illustrated in FIG. 1.
Figure 10:
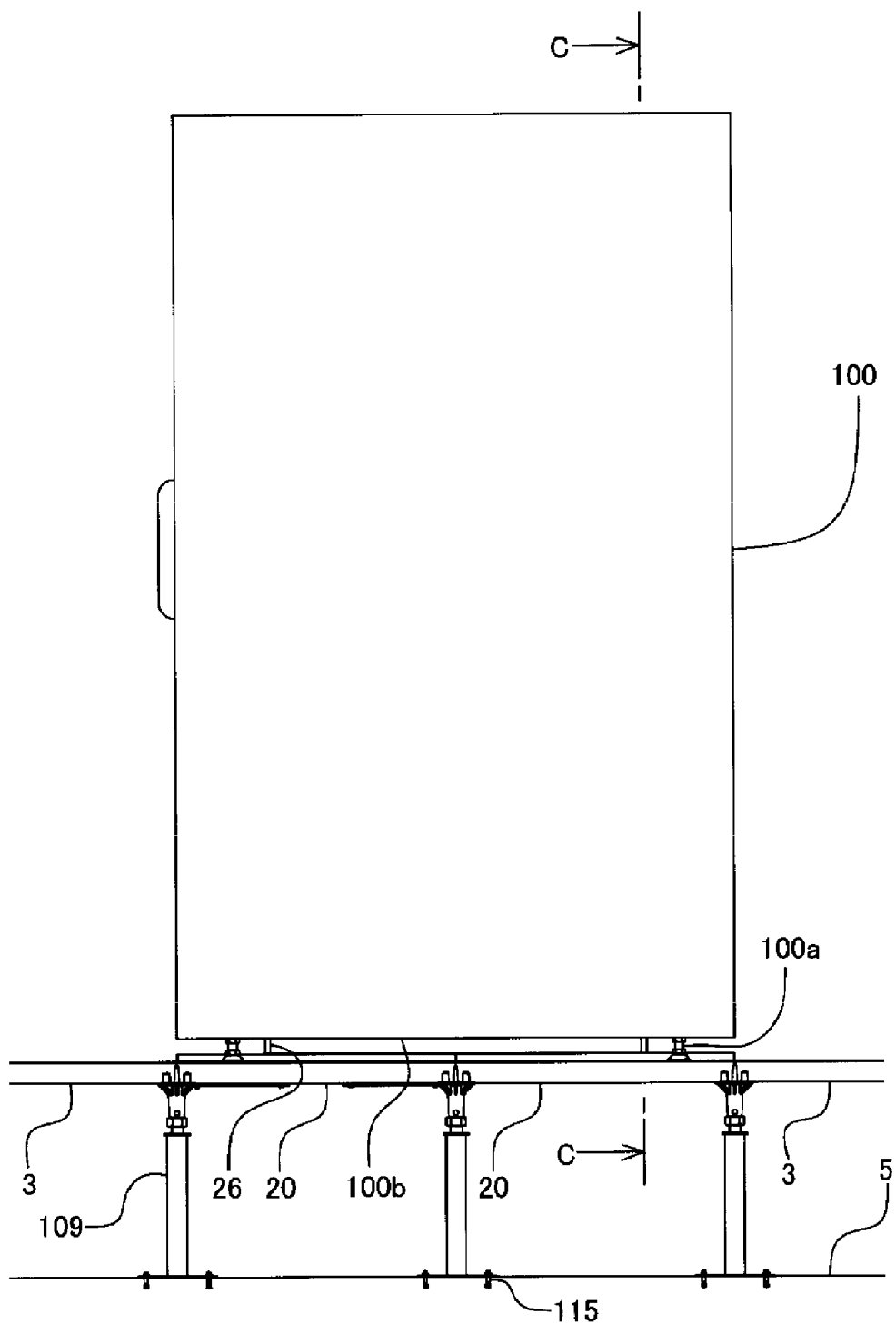
FIG. 10 is a side view of the server rack 100 that is installed on the upper surface of the floor panel 20 illustrated in FIG. 1.

As illustrated in FIGS. 9 and 10, server racks 100 (cases), which include leg parts 100a mounted on bottom plate portions 100b thereof, are placed on the upper surface of the floor panel 20. Furthermore, four corners of the floor panel 20 are supported by support legs 109, respectively.

A through-hole 20a (see FIGS. 1 and 2), which pass through the floor panel 20 in a direction perpendicular to the plane of FIG. 1, and a stepped face, which is slightly recessed from the upper surface of the floor panel 20 toward the lower side of the floor (in a downward direction in FIG. 9) so as to surround the through-hole 20a, are formed at each of the four corners of the floor panel 20.

Head portions of bolts (not illustrated), which are inserted into the through-holes 20a from the upper surface of the floor panel 20, are engaged with the stepped faces and male screw portions of the bolts are fastened to female screw holes (not illustrated) that are formed on the support surfaces of the support legs 109 (see FIG. 9). Accordingly, the four corners of the floor panel 20 are fixed to the support legs 109, respectively.

Further, the support legs 109 have a load bearing property so as to be capable of bearing the load of the server racks 100, and leg portions of the support legs 109 are fixed to a foundation floor face 5 by anchor bolts 115 as illustrated in FIGS. 9 and 10.

Furthermore, through-holes 100c, which pass through a bottom plate portion 100b of the server rack 100 in a thickness direction (a vertical direction in FIG. 11) of the bottom plate portion 100b, are formed in the bottom plate portion 100b (see FIG. 11) of the server rack 100.

Incidentally, a required number of first guide rails 24 are fixed to the floor panel 20 illustrated in FIG. 9. For this reason, the floor panel 20 to which two first guide rails 24 are fixed as in FIG. 1 and the floor panel 20 to which only one first guide rail 24 is fixed are illustrated in FIG. 9.

Figure 11:
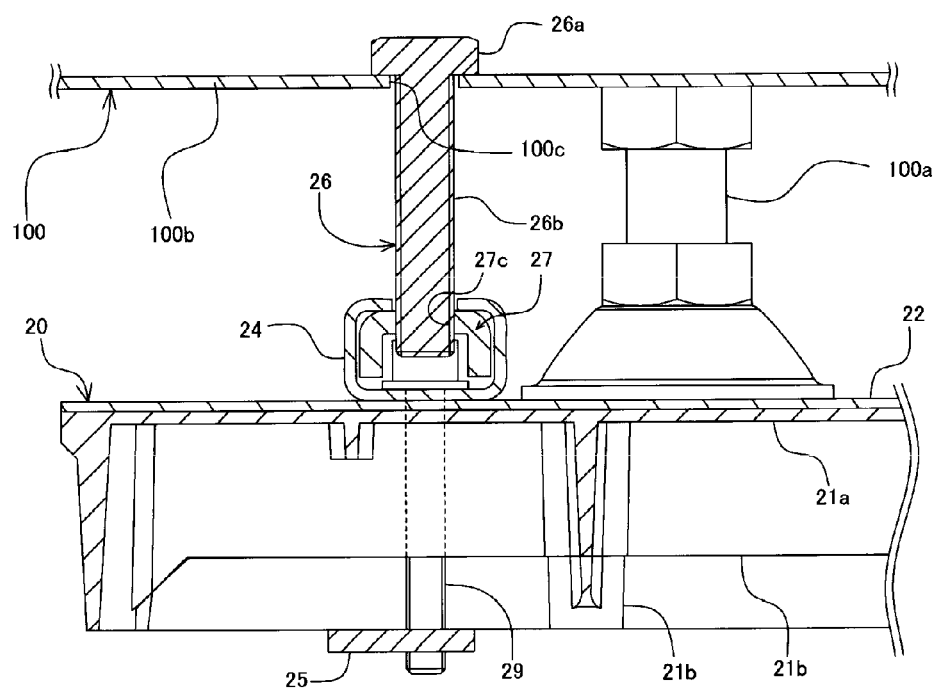
FIG. 11 is a cross-sectional view taken along line C-C from which a part of a connection portion between the floor panel 20 and the server rack 100 illustrated in FIG. 10 is omitted.

As illustrated in FIG. 11, the lower surface of a head portion 26a of the fixing bolt 26 comes into contact with and is engaged with the upper surface of the bottom plate portion 100b of the server rack 100, and a tip portion of the male screw portion 26b of the fixing bolt 26 is inserted into the through-hole 100c of the server rack 100 and the opening of the first guide rail 24 and is fastened to the female screw hole 27c formed in the upper plate portion 27a of the slide member 27 (see FIG. 8).

Since the lower surface of the head portion 26a of the fixing bolt 26 is engaged with the upper surface of the bottom plate portion 100b of the server rack 100 and the male screw portion 26b of the fixing bolt 26 is fastened to the slide member 27, which is provided so as not to get out of the first guide rail 24 upward, as described above, the server rack 100 is connected to the floor panel 20 by the fixing bolts 26 so as not to be separated upward from the upper surface of the floor panel 20 and fall down.

Further, when the horizontal position of the slide members 27 in FIG. 1 does not correspond to the through-hole 100c of the server rack 100 connected to the floor panel 20, it is possible to align the position of the slide member 27 with the position of the through-hole 100c of the server rack 100 by moving the slide member 27 in the longitudinal direction of the first guide rail 24.

Furthermore, in FIG. 1, the fixing bolt 26, which connects the server rack 100 to the floor panel 20, is fastened to the middle female screw hole 27c of the slide member 27 in FIG. 1 among the three female screw holes 27c (see FIG. 6) formed in the slide member 27.

However, when the slide members 27 are moved along the first guide rails 24 and the fixing bolts 26 are fastened to the middle female screw holes 27c of the slide members 27 in FIG. 1 at the positions of the right end portions of the first guide rails 24 in FIG. 1 so that the server rack 100 and the floor panel 20 are connected to each other by the fixing bolts 26, there is a concern that the right end portion of the slide member 27 in the longitudinal direction in FIG. 1 may protrude to the outside of the first guide rail 24 in the longitudinal direction.

For this reason, for example, when stoppers, which prevent the slide member 27 from protruding to the outside of the first guide rail 24 in the longitudinal direction, are provided at both longitudinal end portions of the first guide rail 24, the middle female screw hole 27c of the slide member 27 in FIG. 1 cannot be aligned with the position of the right end portion of the first guide rail 24 in FIG. 1.

Figure 12:
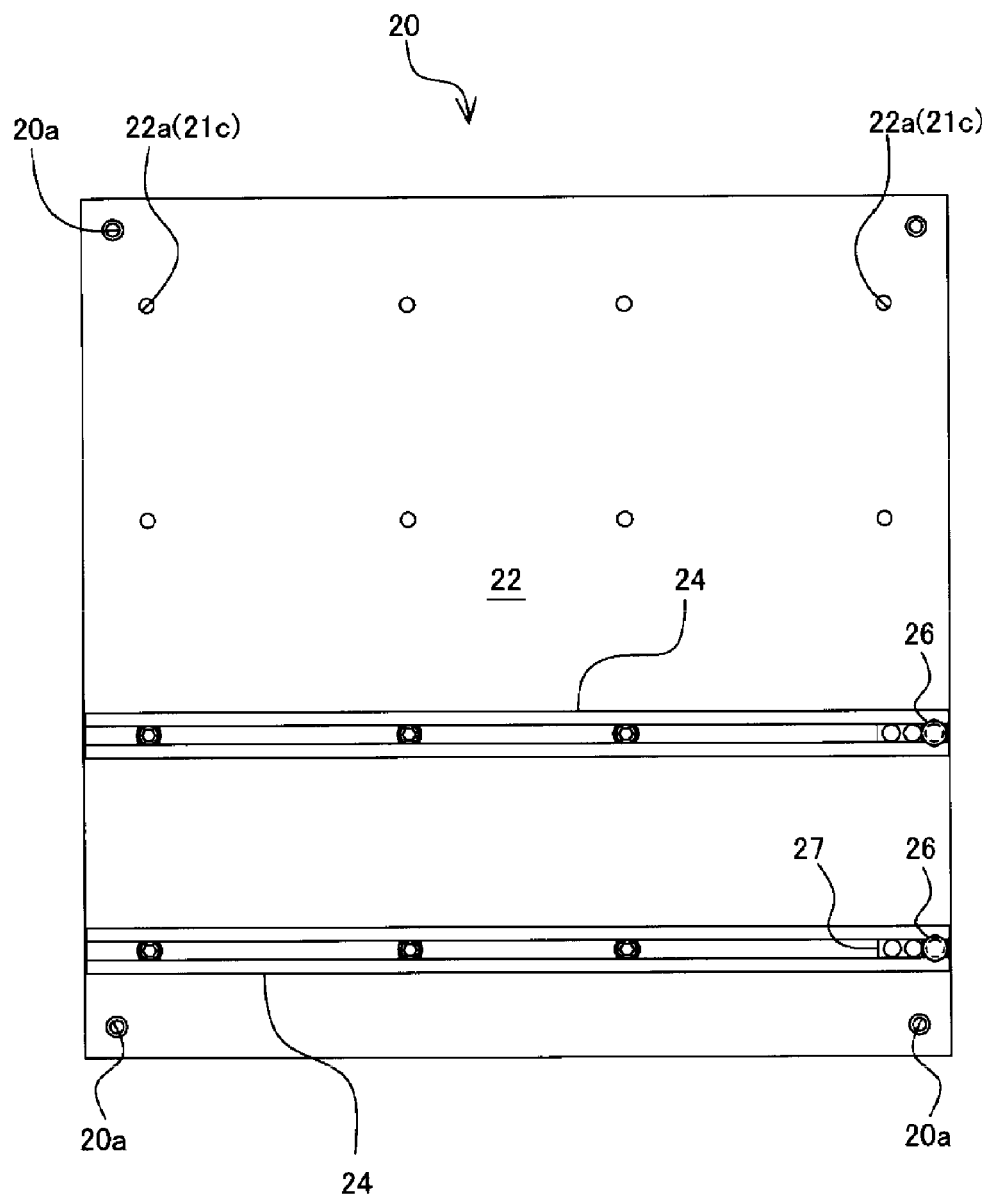
FIG. 12 is a top view of the floor panel 20 when the floor panel 20 and the server rack 100 are connected to each other at right end portions of first guide rails 24 illustrated in FIG. 1.

In such a case, when the fixing bolt 26 is fastened to the rightmost female screw hole 27c in FIG. 6 among the three female screw holes 27c (see FIG. 6) formed in the slide member 27 as illustrated in FIG. 12, it is possible to prevent the right end portion of the slide member 27 in the longitudinal direction in FIG. 12 from protruding to the outside of the first guide rail 24 in the longitudinal direction.

That is, when the rightmost female screw hole 27c of the slide member 27 in FIG. 1 is aligned with the position of the right end portion of the first guide rail 24 in FIG. 1 even when the above-mentioned stoppers are provided at both longitudinal end portions of the first guide rail 24, the server rack 100 and the floor panel 20 can be connected to each other by the fixing bolts 26.

The same is applied to a case in which the slide members 27 are moved along the first guide rails 24 and the server rack 100 and the floor panel 20 are connected to each other by the fixing bolts 26 at the positions of the left end portions of the first guide rails 24 in FIG. 1.

That is, when the fixing bolt 26 is fastened to the leftmost female screw hole 27c in FIG. 1 among the three female screw holes 27c (see FIG. 6) formed in the slide member 27, it is possible to prevent the left end portion of the slide member 27 in the longitudinal direction in FIG. 1 from protruding to the outside of the first guide rail 24 in the longitudinal direction.

Further, when the vertical positions of the slide members 27 in FIG. 1 do not correspond to the through-holes 100c of the server rack 100 connected to the floor panel 20, it is possible to change the vertical positions of the slide members 27 in FIG. 1 by changing the fixing positions of the first guide rails 24 on the upper surface of the tile 22 to other positions at which the through-holes 22a are formed.

Figure 13:
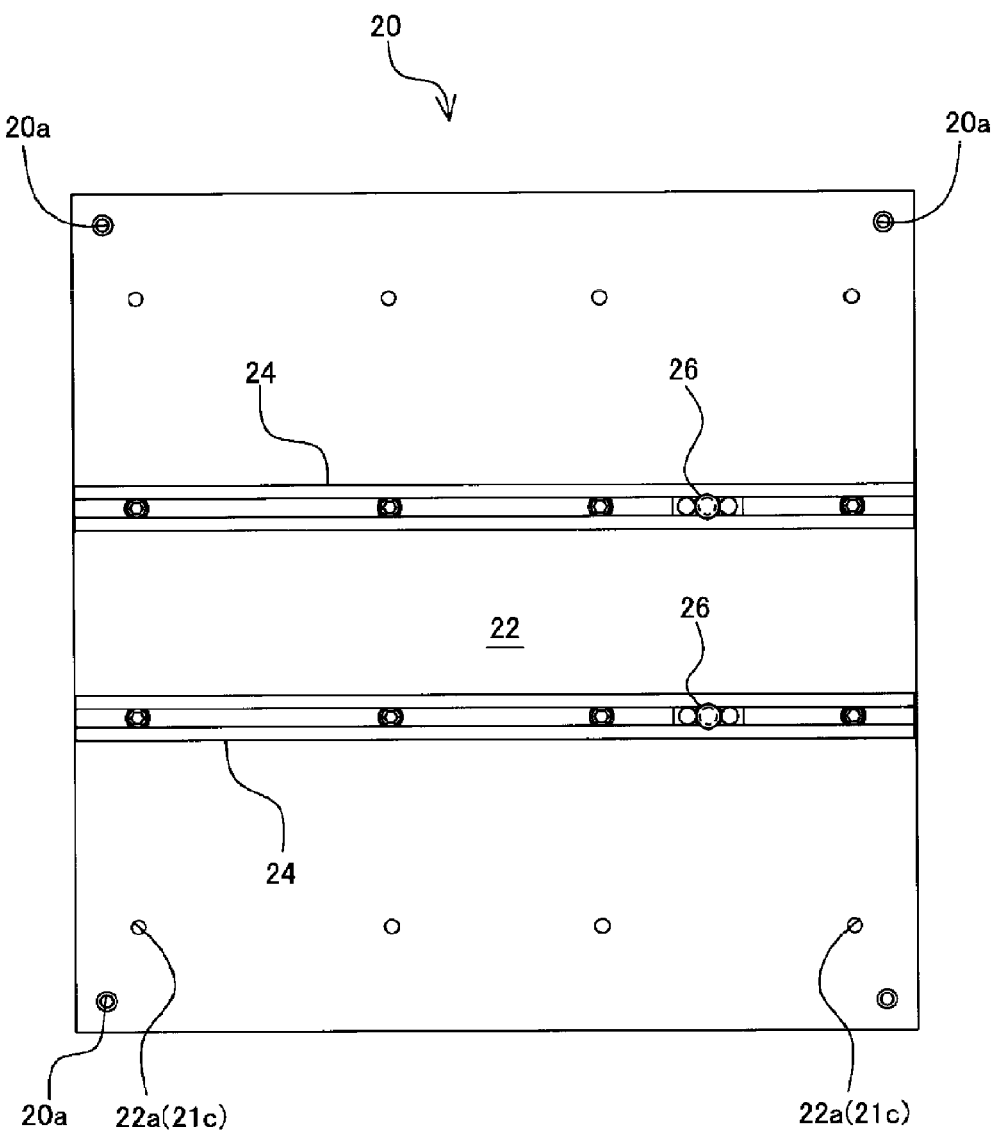
FIG. 13 is a top view of the floor panel 20 when the fixing positions of the first guide rails 24 fixed to the upper surface of the floor panel 20 illustrated in FIG. 1 are changed.

For example, in FIG. 1, the two first guide rails 24 are fixed to the positions of the through-holes 22a that are formed side by side along two lower rows, which extend in the horizontal direction in FIG. 1, on the upper surface of the tile 22. However, in order to align the vertical positions of the slide members 27 in FIG. 1 with the positions of the through-holes 100c of the server rack 100, it is possible to change the fixing positions of the two first guide rails 24 to the positions of the through-holes 22a that are formed side by side along two middle rows, which extend in the horizontal direction in FIG. 1, in the vertical direction in FIG. 1 on the upper surface of the tile 22 as illustrated in FIG. 13.

As described above, the sizes (width and depth) of the server rack 100 vary for each product. Accordingly, even when the positions of the through-holes 100c of the server rack 100 vary for each product, it is possible to align the horizontal positions of the slide members 27 to which the fixing bolts 26 are fastened with the horizontal positions of the through-holes 100c of the server rack 100 by changing the fixing positions of the first guide rails 24 or moving the slide members 27 in the longitudinal directions of the first guide rails 24.

Accordingly, if the floor panel 20 according to this embodiment is used in work for the installation of the server rack 100, a plurality of through-holes, which are used to fix the server rack 100, do not need to be formed in the floor panel 20 in advance while assuming the horizontal positions of the through-holes 100c varying for each server rack 100 as a product.

Further, if the floor panel 20 according to this embodiment is used in the work for the installation of the server rack 100, through-holes, which are used to fix the server rack 100, do not need to be formed in the floor panel 20 whenever the horizontal positions of the through-holes 100c varying for each server rack 100 as a product are present at positions that cannot be assumed in advance.

Accordingly, if the floor panel 20 according to this embodiment is used in the work for the installation of the server rack 100, it is possible to prevent an increase in the cost required for the work for the installation of the server rack 100 and to prevent the reduction of construction efficiency.

FIGS. 14 to 26 are views illustrating a floor panel 30 (double-floor member) according to a second embodiment of the invention.

Figure 14:
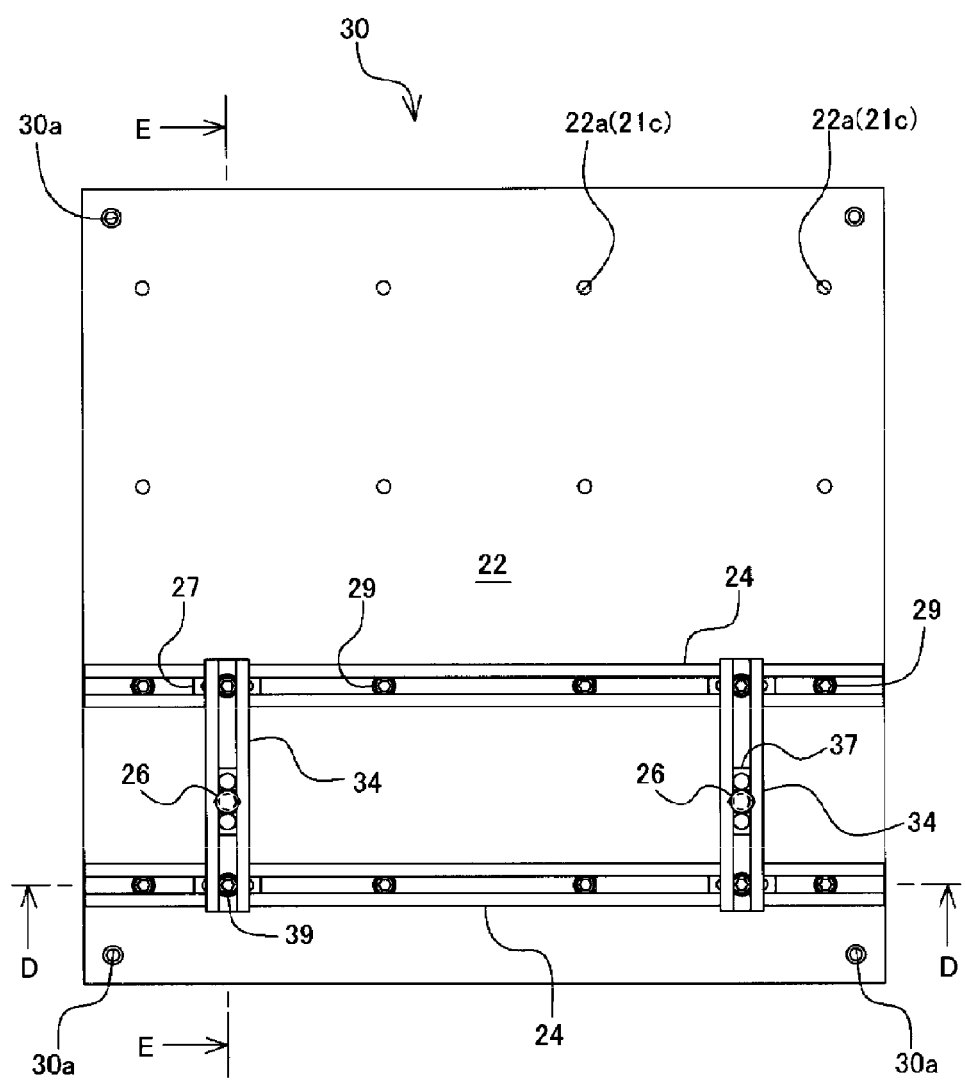
FIG. 14 is a top view of a floor panel 30 according to a second embodiment of the invention.
Figure 15:
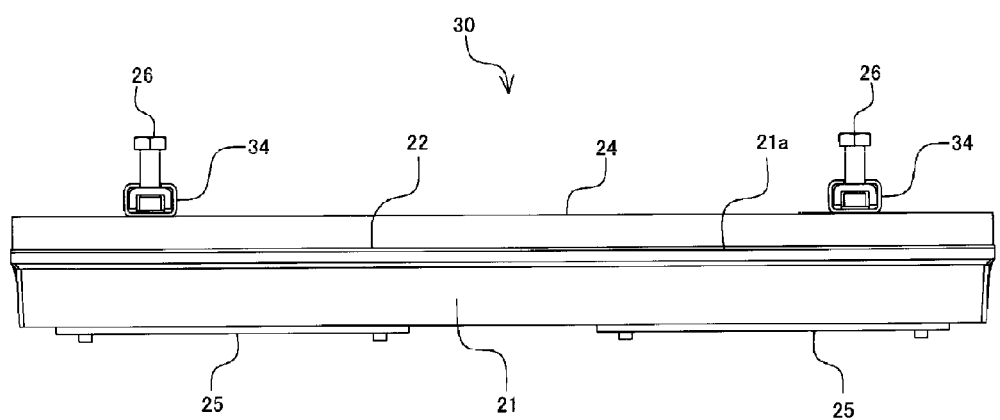
FIG. 15 is a front view of the floor panel 30 illustrated in FIG. 14.
Figure 16:
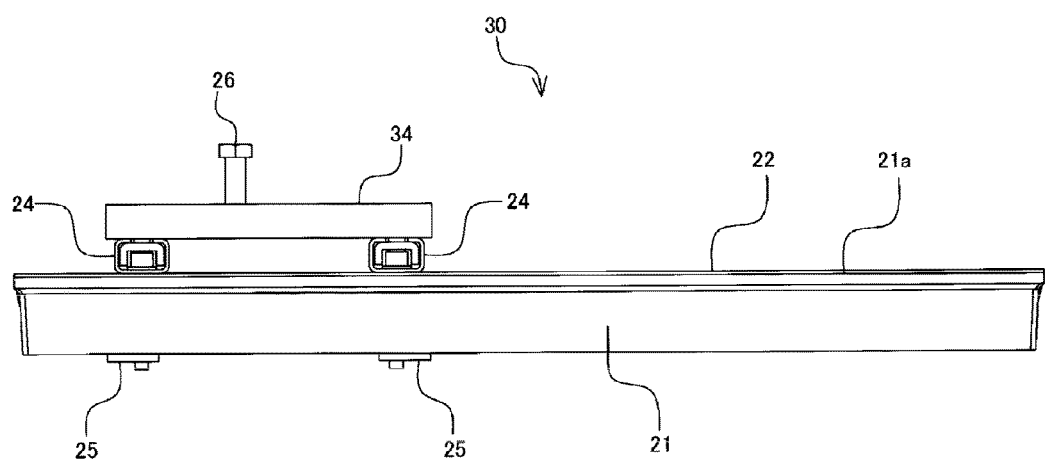
FIG. 16 is a right side view of the floor panel 30 illustrated in FIG. 14.
Figure 17:
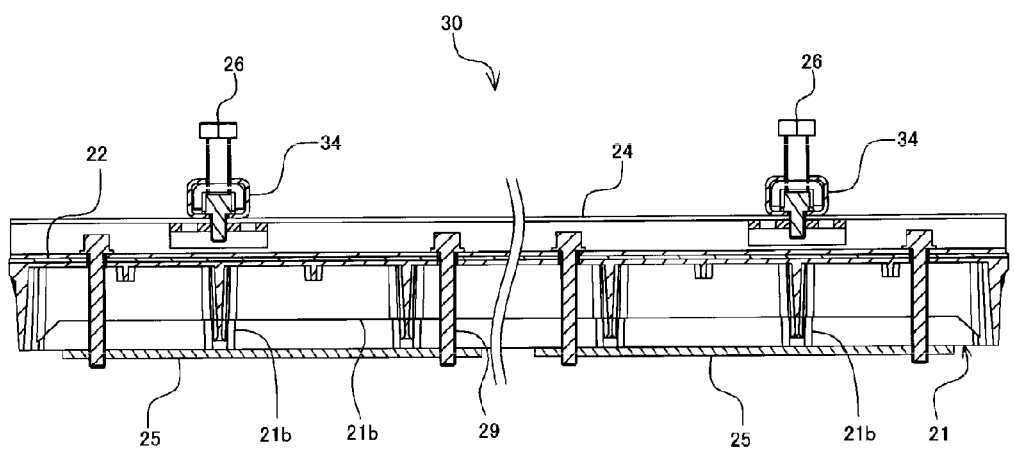
FIG. 17 is a cross-sectional view taken along line D-D from which a part of the floor panel 30 illustrated in FIG. 14 is omitted.

A floor panel 30 according to this embodiment is different from the floor panel 20 according to the first embodiment in that the floor panel 30 includes second guide rails 34 and slide members 37 (second connecting member) in addition to the first guide rails 24 and the slide members 27 as illustrated in FIG. 14. Other structures of the floor panel 30 are the same as those of the floor panel 20 according to the first embodiment.

That is, in the floor panel 20 according to the first embodiment, as illustrated in FIG. 1, two first guide rails 24 extending in the horizontal direction in FIG. 1 are fixed to the upper surface of the tile 22 and it is possible to align the horizontal positions of the slide members 27 with the horizontal positions of the through-holes 100c of the server rack 100 by moving the slide members 27 in the longitudinal directions of the first guide rails 24.

Meanwhile, in the floor panel 30 according to this embodiment, as illustrated in FIG. 14, two first guide rails 24 extending in a horizontal direction in FIG. 14 are fixed to the upper surface of the tile 22 and both longitudinal end portions of two second guide rails 34 extending in a vertical direction in FIG. 14 are fixed to the upper surfaces of the first guide rails 24 (see FIG. 16) so that the second guide rails 34 are orthogonal to the two first guide rails 24 (are bridged between the first guide rails 24).

Further, when the slide members 27 are moved in the longitudinal directions of the first guide rails 24, the second guide rails 34 can be moved in the horizontal direction in FIG. 14. The slide members 37 can be moved in the longitudinal direction of the second guide rails 34.

For this reason, when the slide members 37 are moved along the longitudinal directions of the first and second guide rails 24 and 34 in the horizontal direction and the vertical direction in FIG. 14, the horizontal positions of the slide members 37 can be aligned with the horizontal positions of the through-holes 100c of the server rack 100.

Figure 18:
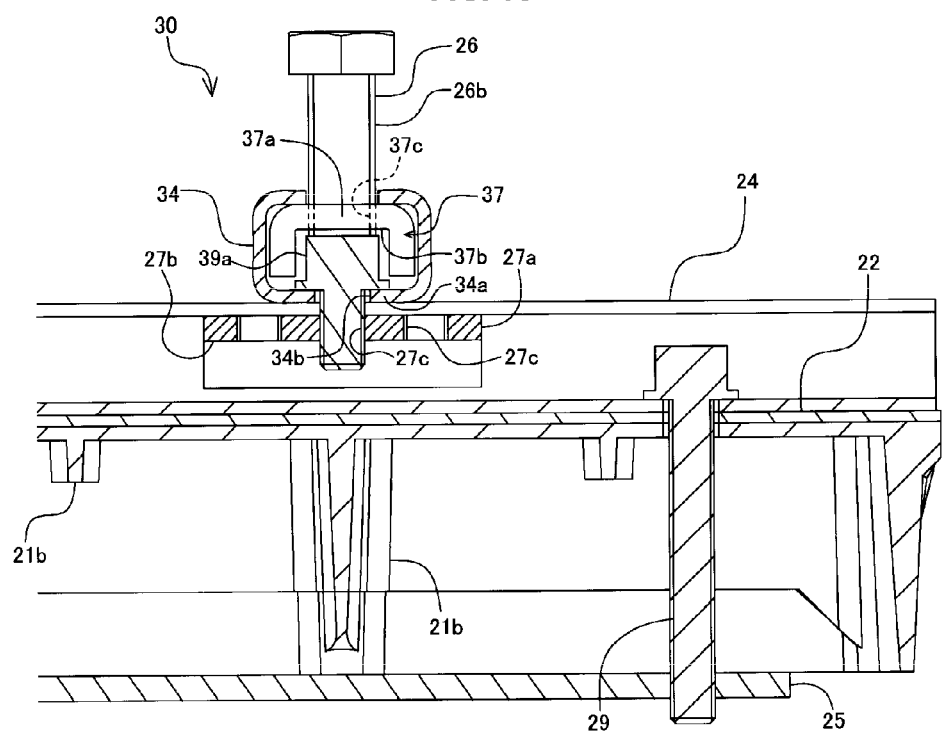
FIG. 18 is a partially enlarged cross-sectional view of a right portion of FIG. 17.
Figure 19:
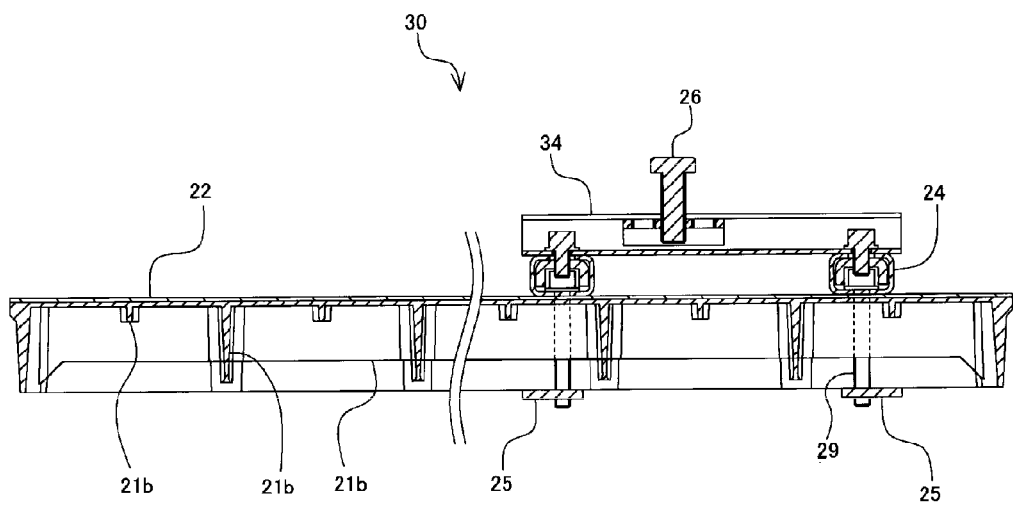
FIG. 19 is a cross-sectional view taken along line E-E from which a part of the floor panel 30 illustrated in FIG. 14 is omitted.

Through-holes 34b (see FIG. 18), which pass through a bottom plate portion 34a in a thickness direction of the bottom plate portion 34a, are formed in the bottom plate portion 34a (see FIG. 20), which comes into contact with the upper surfaces of the first guide rails 24, at both longitudinal end portions of the second guide rails 34, and each of the second guide rails 34 is disposed so that the through-holes 34b communicate with the middle female screw holes 27c in the horizontal direction in FIG. 18 among the three female screw holes 27c of each slide member 27.

Figure 20:
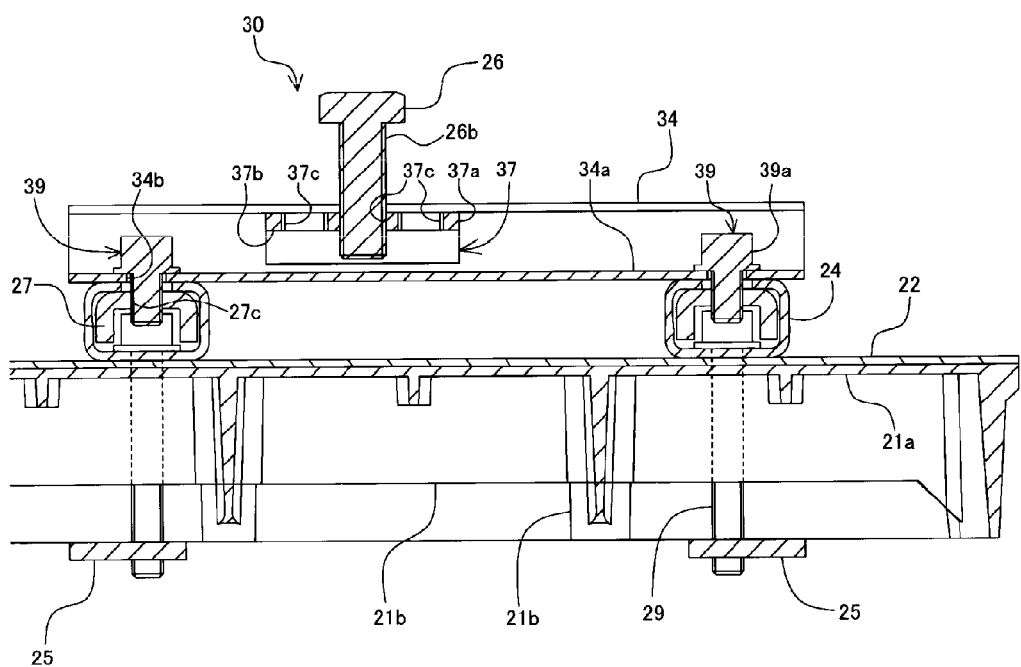
FIG. 20 is a partially enlarged cross-sectional view of a right portion of FIG. 19.

Further, as illustrated in FIG. 20, the lower surfaces of head portions 39a of bolts 39 come into contact with and are engaged with the upper surface of the bottom plate portion 34a of the second guide rail 34, and male screw portions of the bolts 39 are fastened to the female screw holes 27c of the slide members 27. Accordingly, both longitudinal end portions of the second guide rail 34 are connected to the slide members 27 that are movable along the first guide rails 24.

Furthermore, steel or the like is used as the material of each of the slide members 37, and each of the slide members 37 is formed so as to have a U-shaped cross-sectional shape perpendicular to the longitudinal direction thereof (see FIG. 18). Each of the slide members 37 is disposed in the second guide rail 34 in an inverted U shape so that an opening of the U-shaped slide member faces the lower side in FIG. 18.

Moreover, each of the slide members 37 is formed so that the height position of a lower surface 37b (see FIGS. 18 and 20) of an upper plate portion 37a opposite to the opening of the U-shaped slide member 37 is higher than the height position of the upper surface of the head portion 39a of the bolt 39.

In addition, the slide member 37 is formed so that the width (the length in the horizontal direction in FIG. 18) of the opening of the U-shaped slide member 37 is larger than the diameter (the length in the horizontal direction in FIG. 18) of the head portion 39a of the bolt 39.

For this reason, when the slide member 37 is moved in the longitudinal direction of the second guide rails 34, the slide member 37 can be freely moved from the upper end portion of the second guide rail 34 in FIG. 14 to the lower end portion thereof in FIG. 14 without coming into contact with the head portion 39a of the bolt 39.

Further, the width (the length in the horizontal direction in FIG. 18) of the upper plate portion 37a of the slide member 37 is larger than the width (the length in the horizontal direction in FIG. 18) of the opening of the second guide rail 34 opened to the upper side.

For this reason, the upward movement of the slide member 37 in FIG. 18 is limited by the engagement between the slide member 37 and the second guide rails 34. Accordingly, the slide member 37 is formed so as not to get out of (be separated from) the second guide rail 34 through the opening of the second guide rail 34 even when the slide member 37 is pulled upward in FIG. 18.

Furthermore, three female screw holes 37c, which pass through the upper plate portion 37a in a thickness direction of the upper plate portion 37a (a vertical direction in FIG. 20), are formed in the upper plate portion 37a of the slide member 37 side by side in the longitudinal direction of the slide member 37 (a horizontal direction in FIG. 20).

Further, as illustrated in FIG. 18, each of the three female screw holes 37c of the upper plate portion 37a of the slide member 37 is formed so that a male screw portion 26b of a fixing bolt 26, which is inserted through the opening of the second guide rail 34 opened to the upper side in FIG. 18, can be fastened to the female screw hole 37c.

Figure 21:
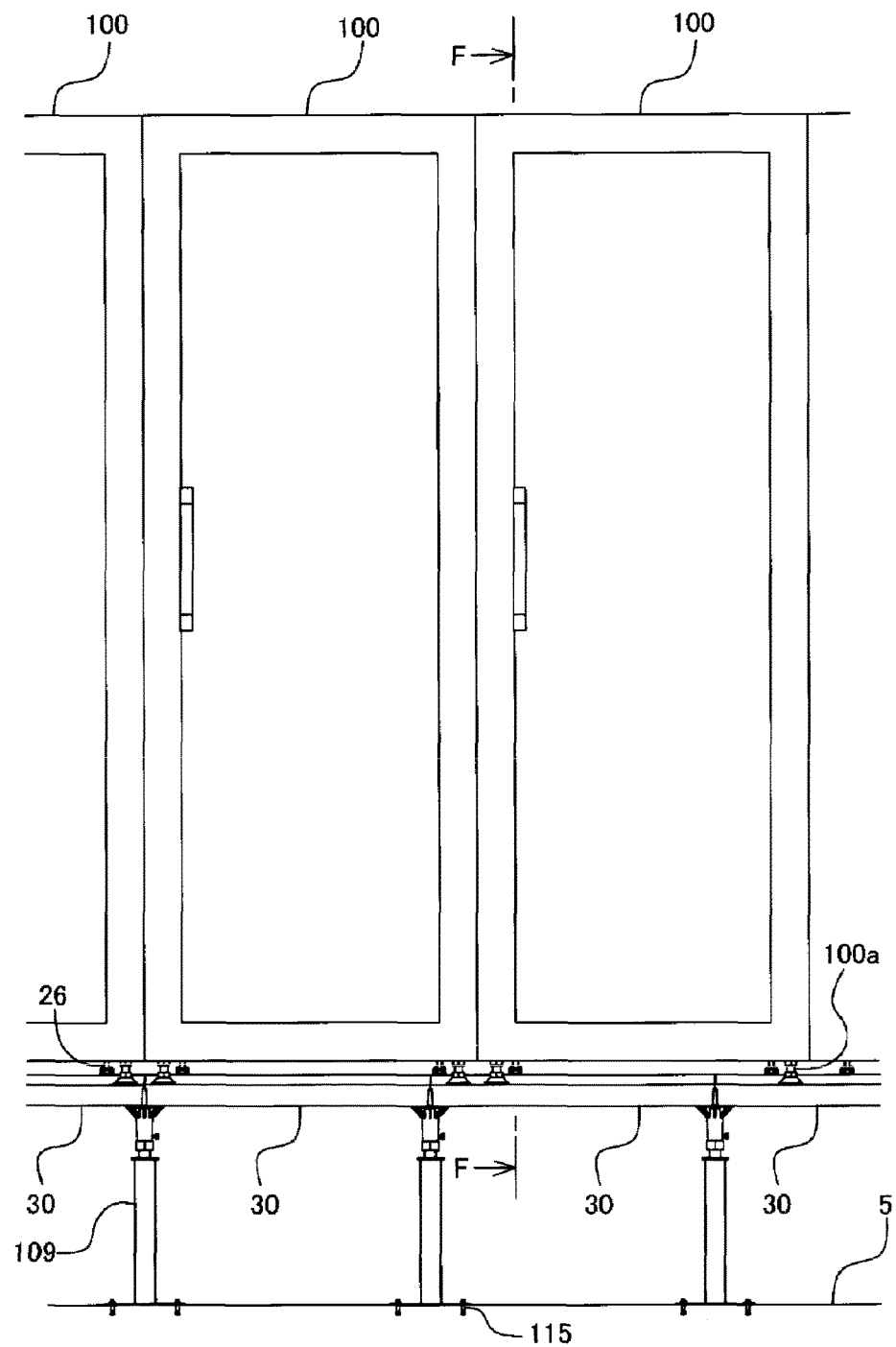
FIG. 21 is a front view of server racks 100 that are installed on the upper surface of the floor panel 30 illustrated in FIG. 14.
Figure 22:
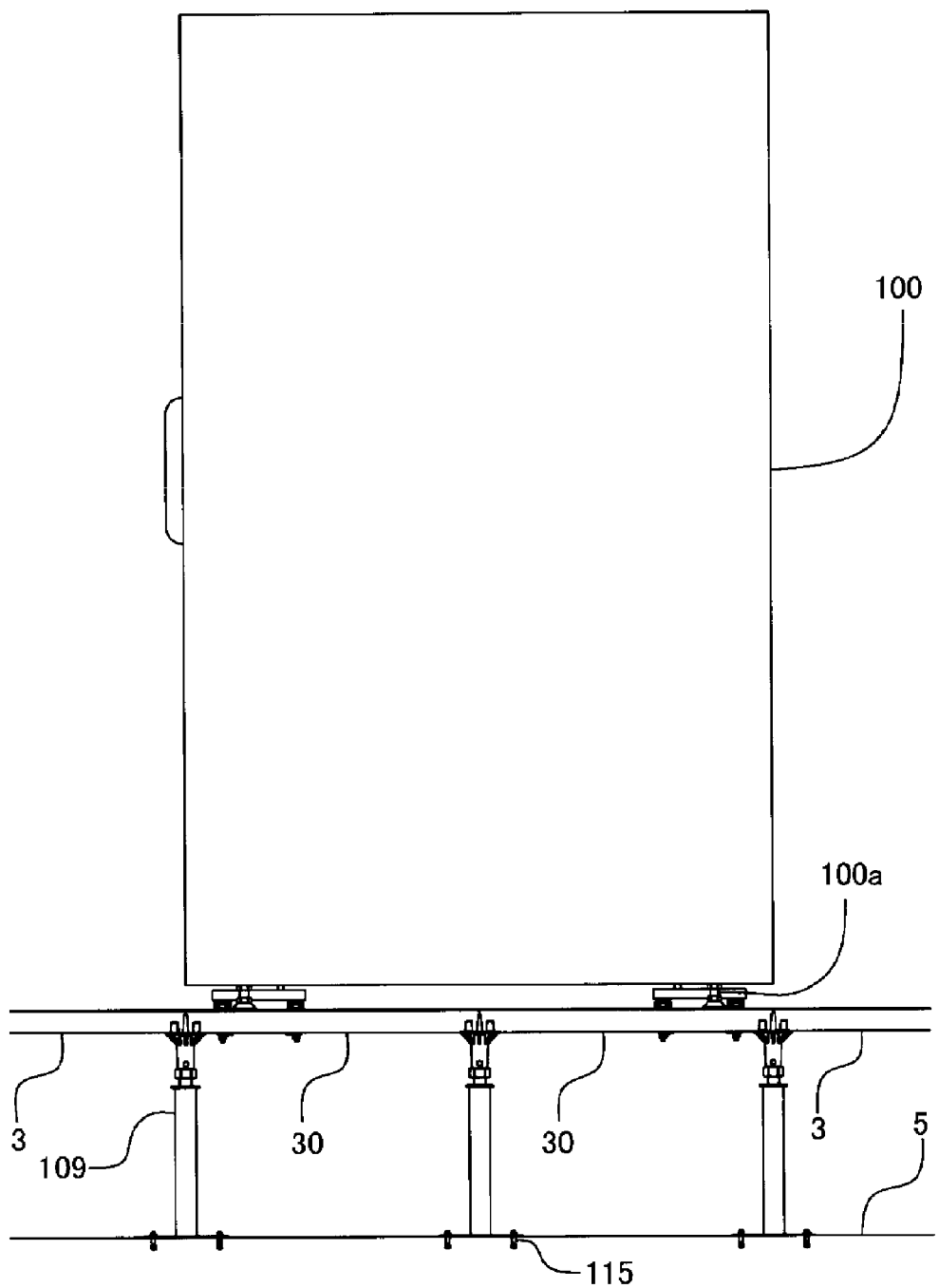
FIG. 22 is a side view of the server rack 100 that is installed on the upper surface of the floor panel 30 illustrated in FIG. 14.

As illustrated in FIGS. 21 and 22, server racks 100, which include leg parts 100a mounted on bottom plate portions 100b thereof, are placed on the upper surface of the floor panel 30. Furthermore, through-holes 100c, which pass through the bottom plate portion 100b in a thickness direction of the bottom plate portion 100b (a vertical direction in FIG. 23), are formed in the bottom plate portion 100b (see FIG. 23) of the server rack 100.

Moreover, similar to the floor panel 20 according to the first embodiment, bolts (not illustrated) are inserted into through-holes 30a (see FIG. 14) formed at four corners of the floor panel 30, head portions of the bolts are engaged with stepped faces formed on the upper surface of the floor panel 30, and male screw portions of the bolts are fastened to female screw holes (not illustrated) formed on the support surfaces of support legs 109 (see FIG. 21). Accordingly, the four corners of the floor panel 30 are fixed to the support legs 109, respectively.

Further, the support legs 109 are fixed to a foundation floor face 5 by anchor bolts 115 as illustrated in FIGS. 21 and 22.

Incidentally, a required number of second guide rails 34 are fixed to the floor panel 30 illustrated in FIG. 21. For this reason, the floor panel 30 to which two second guide rails 34 are fixed as in FIG. 14 and the floor panel 30 to which only one second guide rail 34 is fixed are illustrated in FIG. 21.

Figure 23:
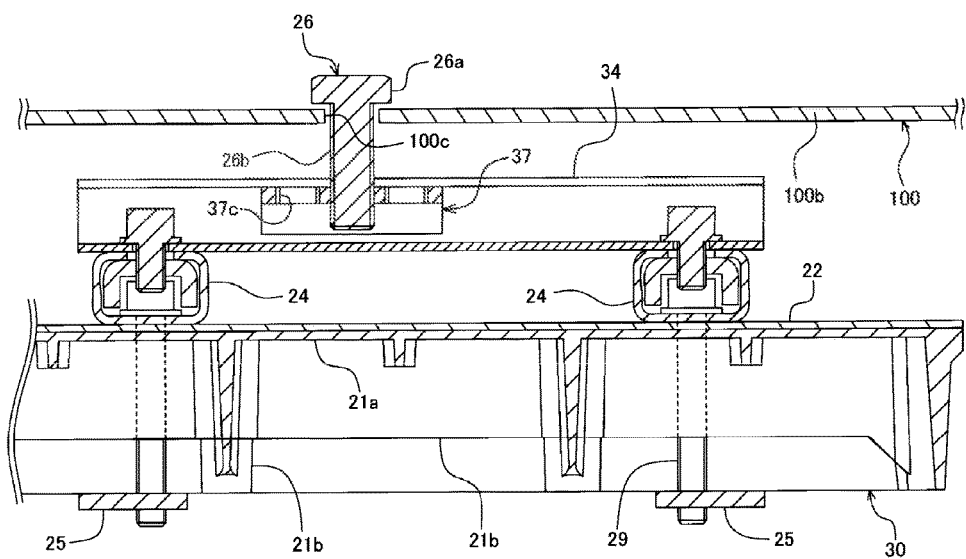
FIG. 23 is a cross-sectional view taken along line F-F from which a part of a connection portion between the floor panel 30 and the server rack 100 illustrated in FIG. 21 is omitted.

As illustrated in FIG. 23, the lower surface of a head portion 26a of the fixing bolt 26 comes into contact with and is engaged with the upper surface of the bottom plate portion 100b of the server rack 100, and a tip of the male screw portion 26b of the fixing bolt 26 is inserted into the through-hole 100c of the bottom plate portion 100b of the server rack 100 and the opening of the second guide rail 34 and is fastened to the female screw hole 37c formed in the upper plate portion 37a of the slide member 37.

Since the lower surface of the head portion 26a of the fixing bolt 26 is engaged with the upper surface of the bottom plate portion 100b of the server rack 100 and the male screw portion 26b of the fixing bolt 26 is fastened to the slide member 37, which is formed so as not to get out of the second guide rail 34 upward, as described above, the server rack 100 is connected to the floor panel 30 by the fixing bolts 26 so as not to be separated upward from the upper surface of the floor panel 30 and fall down.

Accordingly, when the horizontal and vertical positions of the slide member 37 in FIG. 14 do not correspond to the through-hole 100c of the server rack 100 to be connected, it is possible to move the second guide rail 34 in the horizontal direction in FIG. 14 by moving the slide members 27 in the longitudinal directions of the first guide rails 24 and to align the position of the slide member 37 with the position of the through-hole 100c of the server rack 100 to be connected by moving the slide members 37 in the longitudinal directions of the second guide rails 34.

That is, the floor panel 30 is configured so that the slide members 37 can be moved in the longitudinal directions of the first and second guide rails 24 and 34. Accordingly, when the horizontal positions of the through-holes 100c of the bottom plate portion 100b of the server rack 100 are disposed in a range between the two first guide rails 24, it is possible to align the horizontal positions of the slide members 37 with the horizontal positions of the through-holes 100c by moving the slide members 37 in the longitudinal directions of the first and second guide rails 24 and 34.

Figure 24:
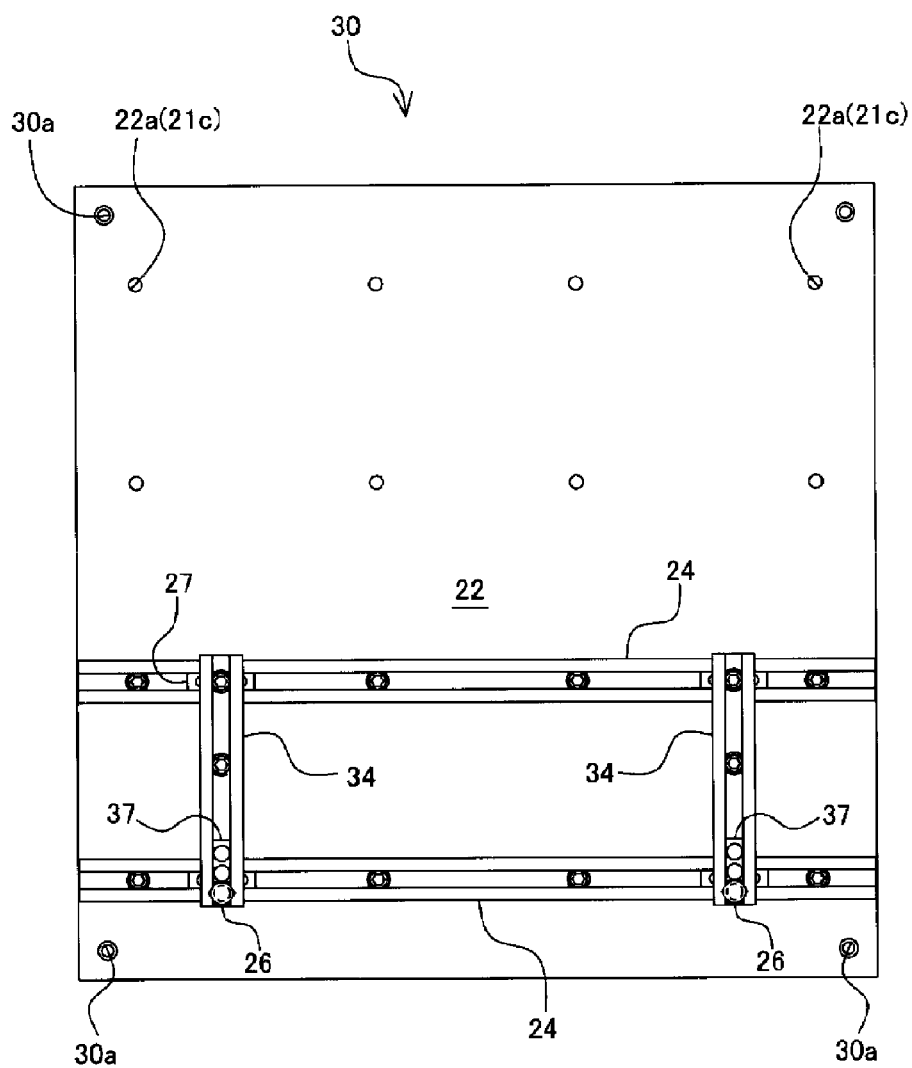
FIG. 24 is a top view of the floor panel 30 when the floor panel 30 and the server rack 100 are connected to each other at lower end portions of second guide rails 34 illustrated in FIG. 14.

Furthermore, in FIG. 14, the fixing bolt 26, which connects the server rack 100 to the floor panel 30, is fastened to the middle female screw hole 37c in FIG. 14 among the three female screw holes 37c formed in the slide member 37 (see FIGS. 20 and 24).

However, when the slide members 37 are moved in the longitudinal directions of the second guide rails 34 and the fixing bolts 26 are fastened to the middle female screw holes 37c in FIG. 14 at the positions of the lower end portions of the second guide rails 34 in FIG. 14 such that the server rack 100 and the floor panel 30 are connected to each other by the fixing bolts 26, there is a concern that the lower end portion of the slide member 37 in the longitudinal direction in FIG. 14 may protrude to the outside of the second guide rail 34 in the longitudinal direction.

For this reason, for example, when stoppers, which prevent the slide member 37 from protruding to the outside of the second guide rail 34 in the longitudinal direction, are provided at both longitudinal end portions of the second guide rail 34, the middle female screw hole 37c of the slide member 37 in FIG. 14 cannot be aligned with the position of the lower end portion of the second guide rail 34 in FIG. 14.

In such a case, when the fixing bolt 26 is fastened to the lowermost female screw hole 37c (see FIG. 20) in FIG. 24 among the three female screw holes 37c formed in the slide member 37 as illustrated in FIG. 24, it is possible to prevent the lower end portion of the slide member 37 in the longitudinal direction in FIG. 24 from protruding to the outside of the second guide rail 34 in the longitudinal direction.

That is, when the lowermost female screw hole 37c of the slide member 37 in FIG. 14 is aligned with the position of the lower end portion of the second guide rail 34 in FIG. 14 even when the above-mentioned stoppers are provided at both longitudinal end portions of the second guide rail 34, the server rack 100 and the floor panel 30 can be connected to each other by the fixing bolts 26.

The same is applied to a case where the slide members 37 are moved along the second guide rails 34 and the server rack 100 and the floor panel 30 are connected to each other by the fixing bolts 26 at the positions of the upper end portions of the second guide rails 34 in FIG. 14.

That is, when the fixing bolt 26 is fastened to the uppermost female screw hole 37c in FIG. 14 among the three female screw holes 37c(see FIG. 20) formed in the slide member 37, it is possible to prevent the upper end portion of the slide member 37 in the longitudinal direction in FIG. 14 from protruding to the outside of the second guide rail 34 in the longitudinal direction.

Further, when the vertical positions of the through-holes 100c of the server rack 100 in FIG. 14 are not formed in a range between the two first guide rails 24, it is possible to change a range, in which the slide members 37 can be moved in the vertical direction in FIG. 14, by changing the fixing positions of the first guide rails 24 on the upper surface of the tile 22 to other positions at which the through-holes 22a are formed.

Figure 25:
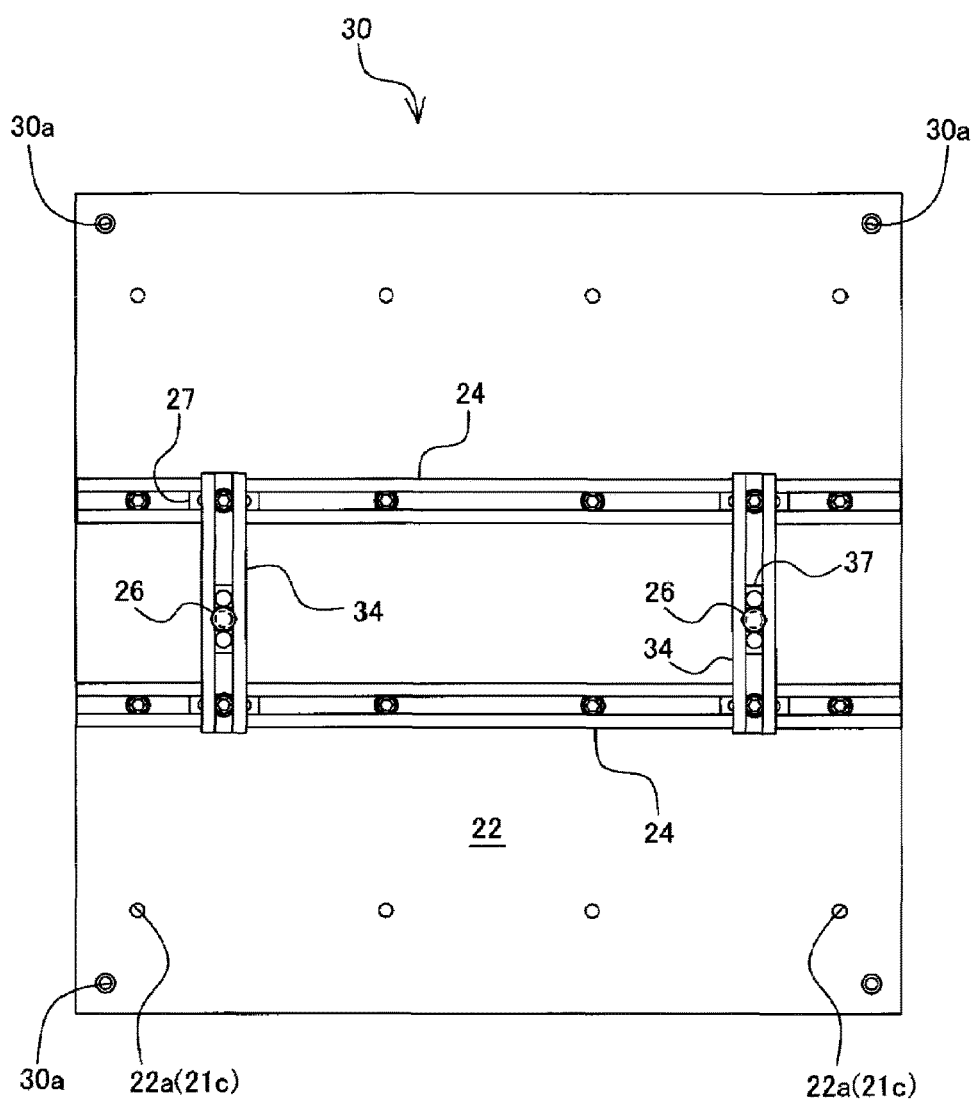
FIG. 25 is a top view of the floor panel 30 when the fixing positions of the first guide rails 24 fixed to the upper surface of the floor panel 30 illustrated in FIG. 14 are changed.

For example, in FIG. 14, the two first guide rails 24 are fixed to the positions of the through-holes 22a that are formed along two lower rows in FIG. 14 on the upper surface of the tile 22. However, in order to align the vertical positions of the slide members 37 in FIG. 14 with the positions of the through-holes 100c of the server rack 100 as illustrated in FIG. 25, it is possible to change the fixing positions of the two first guide rails 24 to the positions of the through-holes 22a that are formed along two middle rows in FIG. 25 on the upper surface of the tile 22.

Figure 26:
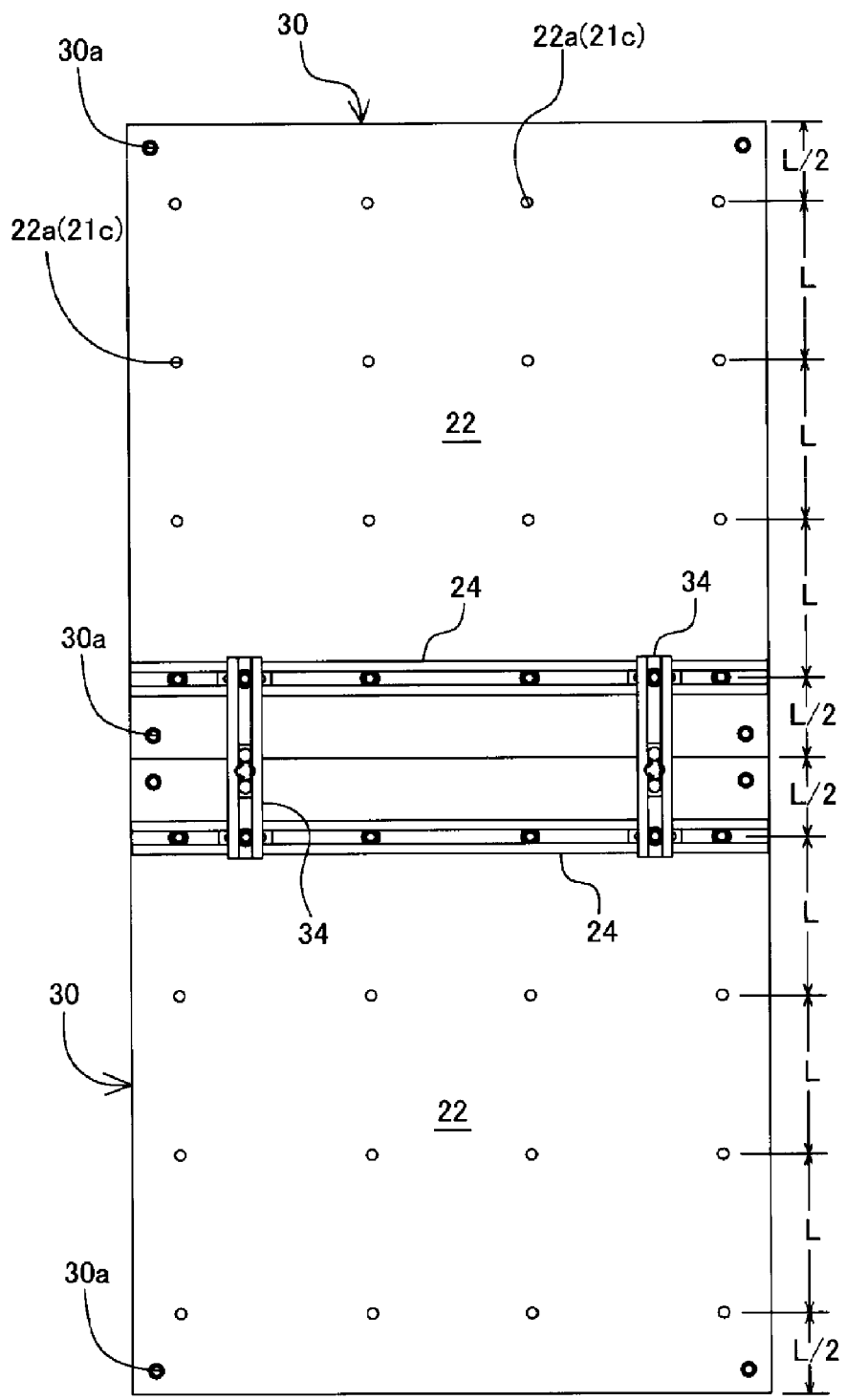
FIG. 26 is a top view of the floor panel 30 when two floor panels 30 illustrated in FIG. 14 are laid side by side and the floor panels 30 and the server rack 100 are connected to each other at the peripheral edge portions of the floor panels 30.

Furthermore, as illustrated in FIG. 26, the plurality of through-holes 22a and 21c of the tile 22 and the panel body 21, which are formed at intervals, are formed so as to be separated from each other in the vertical direction in FIG. 26 by a length L. Moreover, the through-holes 22a and 21c, which are formed at the outermost peripheral portion of the floor panel 30 in FIG. 26, are formed so as to be separated from the sides of the floor panel 30 in the vertical direction in FIG. 26 by a length L/2.

For this reason, when the slide members 37 are moved to the outside of the through-holes 22a and 21c, which are formed at the outermost peripheral portion of the floor panel 30, the second guide rails 34 can be disposed over the floor panels 30 and 30 adjacent to each other as illustrated in FIG. 26.

That is, when one first guide rail 24 is fixed to the through-holes 22a and 21c that are formed at the outermost peripheral portion of each of the floor panels 30 and 30 adjacent to each other, a vertical distance between the first guide rails 24 and 24 fixed to the respective floor panels 30 and 30 adjacent to each other is L (the sum of L/2 and L/2).

Accordingly, since the vertical distance between the first guide rails 24 and 24 fixed to the respective floor panels 30 and 30 adjacent to each other is not L or more, the slide members 37 can also be moved to the peripheral edge portions of the floor panel 30 when both end portions of the second guide rails 34 are connected to the upper surfaces of the two first guide rails 24 over the floor panels 30 and 30.

As described above, the sizes (width and depth) of the server rack 100 vary for each product. Accordingly, even when the positions of the through-holes 100c of the server rack 100 vary for each product, it is possible to align the horizontal positions of the slide members 37 to which the fixing bolts 26 are fastened with the horizontal positions of the through-holes 100c of the server rack 100 by changing the fixing positions of the first guide rails 24, moving the slide members 27 in the longitudinal directions of the first guide rails 24, or moving the slide members 37 in the longitudinal directions of the second guide rails 34.

That is, since the positions of the slide members 37 are moved so as to be aligned with the horizontal positions of the through-holes 100c of the server rack 100 in the floor panel 30 according to this embodiment, the server rack 100 and the floor panel 30 can be connected to each other at an arbitrary position in the horizontal direction.

Accordingly, if the floor panel 30 according to this embodiment is used in work for the installation of the server rack 100, a plurality of through-holes, which are used to fix the server rack 100, do not need to be formed in the floor panel 30 in advance while assuming the horizontal positions of the through-holes 100c that vary for each server rack 100 as a product.

Further, if the floor panel 30 according to this embodiment is used in the work for the installation of the server rack 100, through-holes, which are used to fix the server rack 100, do not need to be formed in the floor panel 30 whenever the horizontal positions of the through-holes 100c varying for each server rack 100 as a product are present at positions that cannot be assumed in advance.

Accordingly, even when the floor panel 30 according to this embodiment is used in the work for the installation of the server rack 100, it is possible to prevent an increase in the cost required for the work for the installation of the server rack 100 and to prevent the reduction of construction efficiency as in the floor panel 20 according to the first embodiment.

Figure 27:
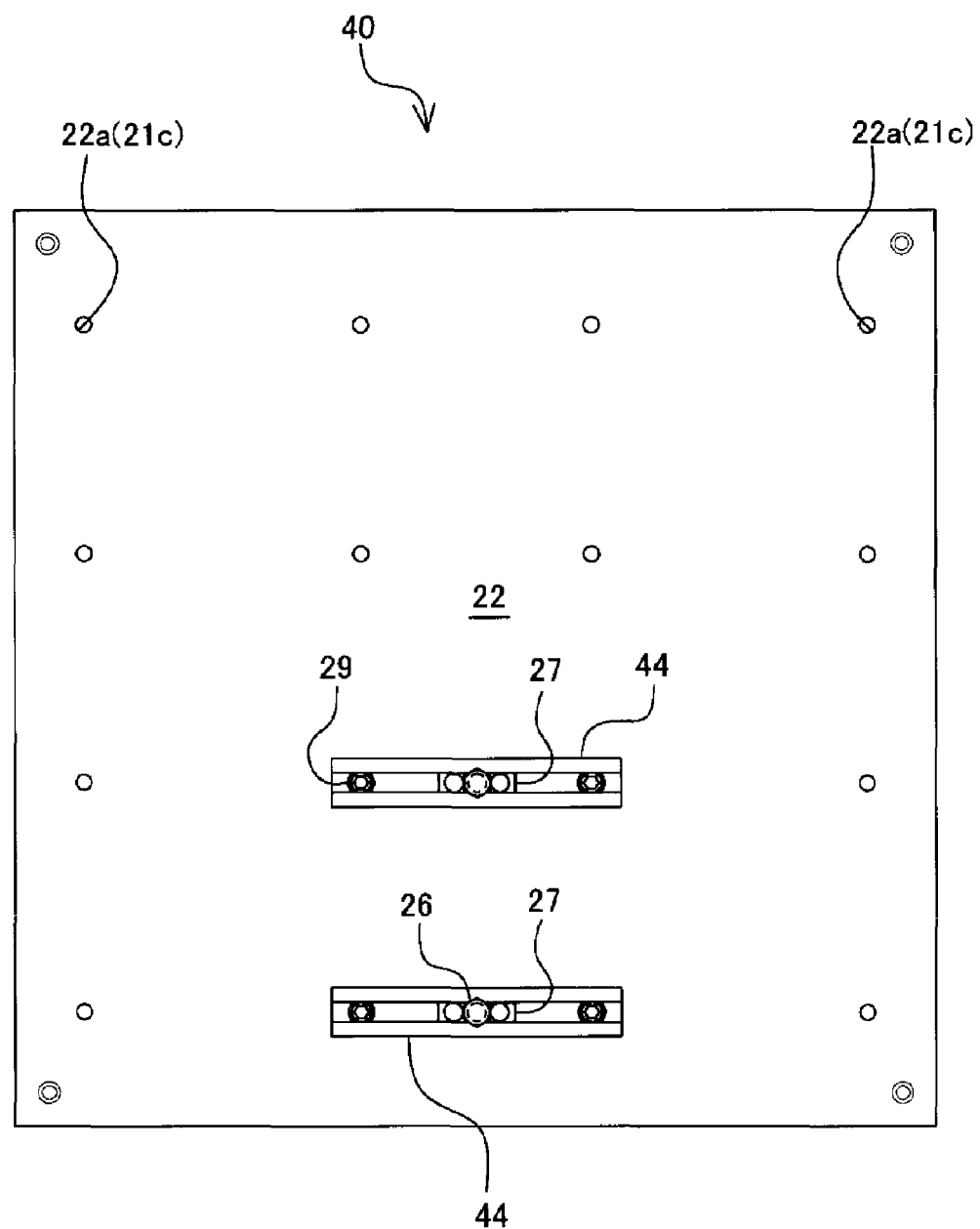
FIG. 27 is a top view of a floor panel 40 according to a third embodiment of the invention.

FIG. 27 is a view illustrating a floor panel 40 (double-floor member) according to a third embodiment of the invention.

The floor panel 40 according to this embodiment is different from the floor panel 20 according to the first embodiment in that the length of a first guide rail 44 is shorter than the length of the first guide rail 24 of the floor panel 20 according to the first embodiment as illustrated in FIG. 27. Other structures of the floor panel 40 are the same as those of the floor panel 20 according to the first embodiment.

That is, in the floor panel 20 according to the first embodiment, as illustrated in FIG. 1, the first guide rails 24 are disposed so as to extend in the horizontal direction in FIG. 1 to the substantially left end potion of the upper surface of the tile 22 from the substantially right end portion thereof in FIG. 1.

Meanwhile, in the floor panel 40 according to this embodiment, as illustrated in FIG. 27, each of the first guide rail 44 is formed to have a length of about ⅓ of the length of the first guide rail 24 of the floor panel 20 so that both end portions of the first guide rail 44 are disposed at the positions of through-holes 22a and 21c adjacent to each other in a horizontal direction in FIG. 27.

Even when the floor panel 40 according to this embodiment is used, it is possible to obtain the same effects as the floor panel 20 according to the first embodiment.

Figure 28:
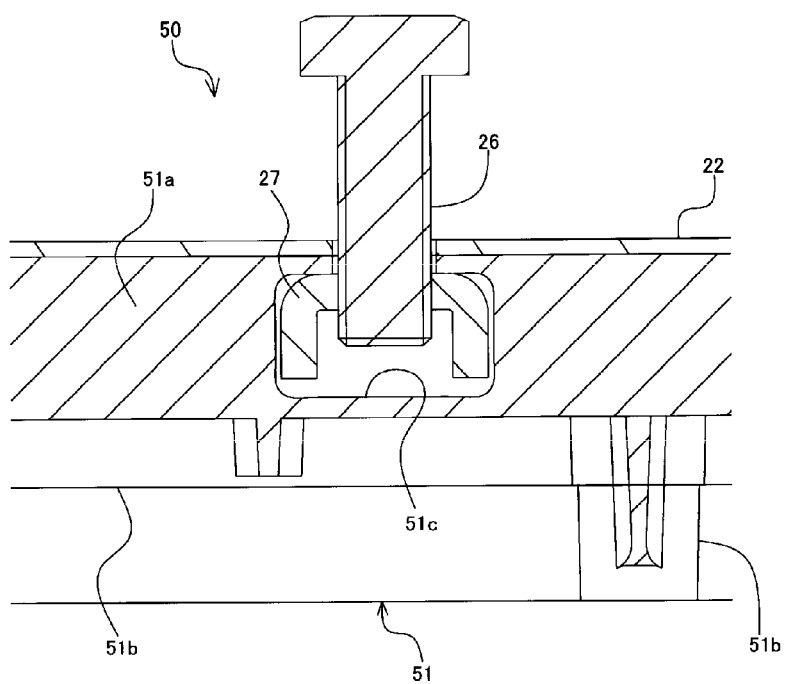
FIG. 28 is a partially enlarged cross-sectional view of a groove rail 51c of a floor panel 50 according to a fourth embodiment of the invention.

FIG. 28 is a view illustrating a floor panel 50 (double-floor member) according to a fourth embodiment of the invention.

The floor panel 50 according to this embodiment is different from the floor panel 20 according to the first embodiment in that groove rails 51c are formed in a panel body 51 and slide members 27 (first connecting member) can be moved in the longitudinal directions of the groove rails 51c (a direction perpendicular to the plane of FIG. 28) as illustrated in FIG. 28. Other structures of the floor panel 50 are the same as those of the floor panel 20 according to the first embodiment.

That is, in the floor panel 20 according to the first embodiment, as illustrated in FIG. 8, the first guide rail 24 is fixed to the upper surface of the tile 22, the slide member 27 is disposed in the first guide rail 24, and it is possible to align the position of the slide member 27 with the position of the through-hole 100c of the server rack 100 by moving the slide member 27 in the longitudinal direction of the first guide rail 24 (see FIG. 11).

Meanwhile, in the floor panel 50 according to this embodiment, as illustrated in FIG. 28, the first guide rails 24 of the floor panel 20 according to the first embodiment are not provided and groove rails 51c, which have a substantially inverted T-shaped cross-sectional shape perpendicular to the longitudinal direction thereof and are recessed from the upper surface of the floor panel 50 toward the lower side of the floor (in a downward direction in FIG. 28) so as to have a predetermined depth, are formed instead of the first guide rails 24.

Similar to the first guide rail 24, the groove rail 51c is formed in a shape in which the slide member 27 is disposed in the groove rail 51c, the slide member 27 can be moved in the longitudinal direction of the groove rail 51c (a direction perpendicular to the plane of FIG. 28), and the slide member 27 does not get out of (be separated from) the groove rail 51c upward.

Since the groove rail 51c passes through the tile 22 from the upper surface of the floor panel 50 and is recessed to a predetermined depth in a flat plate portion 51a of the panel body 51 so that the slide member 27 can be disposed in the groove rail 51c, the thickness of the flat plate portion 51a of the panel body 51 is larger than the thickness (see FIG. 8) of the flat plate portion 21a of the panel body 21 of the floor panel 20 according to the first embodiment.

Even when the floor panel 50 according to this embodiment is used, it is possible to obtain the same effects as the floor panel 20 according to the first embodiment.

Further, since the floor panel 50 according to this embodiment is not provided with the first guide rails 24, it is not necessary to perform work for fixing the first guide rails 24 to the upper surface of the tile 22 by using the bolts 29 and the plate members 25 unlike in the floor panel 20 according to the first embodiment (see FIG. 8).

Figure 29:
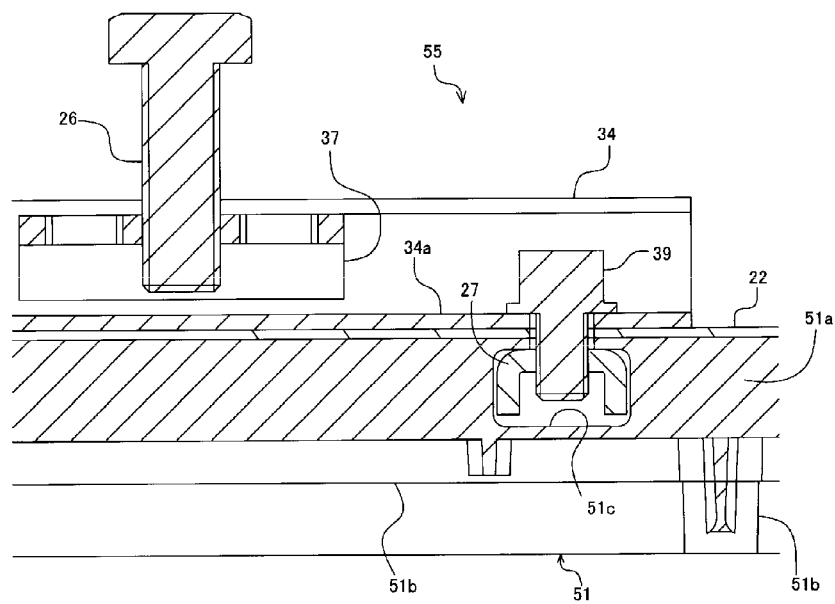
FIG. 29 is a partially enlarged cross-sectional view of a groove rail 51c of a floor panel 55 according to a fifth embodiment of the invention.

FIG. 29 is a view illustrating a floor panel 55 (double-floor member) according to a fifth embodiment of the invention.

The floor panel 55 according to this embodiment is different from the floor panel 30 according to the second embodiment in that groove rails 51c are formed in a panel body 51 and slide members 27 (first connecting member) can be moved in the longitudinal directions of the groove rails 51c (a direction perpendicular to the plane of FIG. 29) as illustrated in FIG. 29. Other structures of the floor panel 55 are the same as those of the floor panel 30 according to the second embodiment.

That is, similar to the floor panel 30 according to the second embodiment having a structure in which the second guide rails 34 and the slide members 37 are provided in the floor panel 20 according to the first embodiment, the floor panel 55 according to this embodiment has a structure in which second guide rails 34 and slide members 37 (second connecting member) are provided in the floor panel 50 according to the fourth embodiment.

Even when the floor panel 55 according to this embodiment is used, it is possible to obtain the same effects as the floor panel 30 according to the second embodiment.

Further, since the floor panel 55 according to this embodiment is not provided with the first guide rails 24, it is not necessary to perform work for fixing the first guide rails 24 to the upper surface of the tile 22 by using the bolts 29 and the plate members 25 unlike in the floor panel 30 according to the second embodiment (see FIG. 20).

Figure 30:
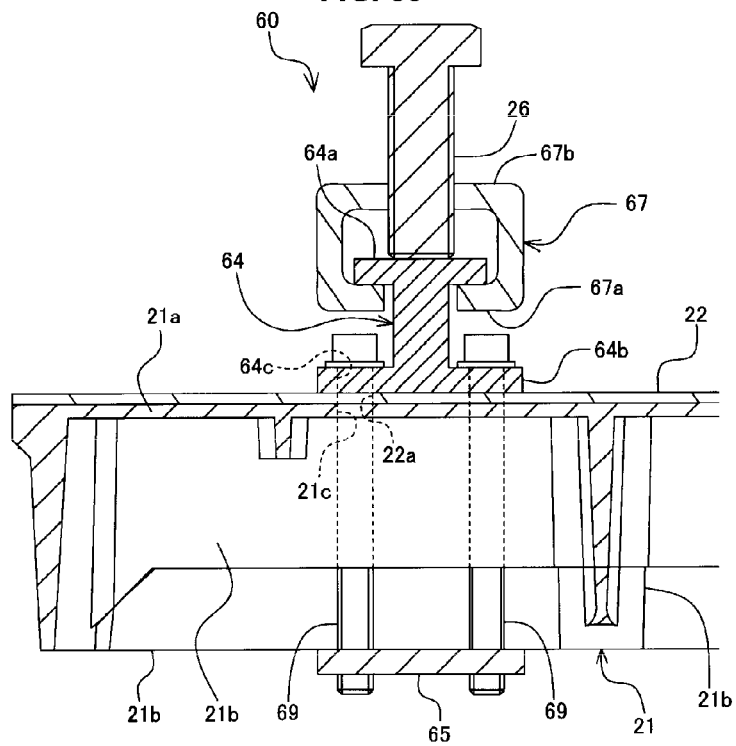
FIG. 30 is a partially enlarged cross-sectional view of a first guide rail 64 of a floor panel 60 according to a sixth embodiment of the invention.

FIG. 30 is a view illustrating a floor panel 60 (double-floor member) according to a sixth embodiment of the invention.

The floor panel 60 according to this embodiment is different from the floor panel 20 according to the first embodiment in that first guide rails 64, which have a substantially T-shaped cross-sectional shape perpendicular to the longitudinal direction thereof (a direction perpendicular to the plane of FIG. 30), are fixed to the upper surface of a tile 22 and slide member 67, which have a C-shaped cross-sectional shape perpendicular to the longitudinal direction thereof (a direction perpendicular to the plane of FIG. 30), are engaged with the first guide rails 64 as illustrated in FIG. 30. Other structures of the floor panel 60 are the same as those of the floor panel 20 according to the first embodiment.

That is, in the floor panel 20 according to the first embodiment, as illustrated in FIG. 8, the first guide rail 24 is formed so as to have a C-shaped cross-sectional shape perpendicular to the longitudinal direction thereof (see FIG. 8) and is fixed to the upper surface of the tile 22 so that the opening of the C-shaped first guide rail faces the upper side (the upper side in FIG. 8). Further, the slide member 27, which has a U-shaped cross-sectional shape perpendicular to the longitudinal direction thereof, is disposed in the first guide rail 24 in an inverted U shape so that the opening of the U-shaped slide member faces the lower side in FIG. 8.

Meanwhile, in the floor panel 60 according to this embodiment, as illustrated in FIG. 30, the first guide rail 64 is fixed to the upper surface of the tile 22 in a substantially inverted T shape so that a flange portion 64b protruding from a lower end portion of the first guide rail 64 in FIG. 30 in a horizontal direction in FIG. 30 comes into contact with the upper surface of the tile 22.

Furthermore, since a lower plate portion 67a of the slide member 67 in which an opening is formed is engaged with a flange portion 64a that protrudes from an upper end portion of the first guide rail 64 in FIG. 30 in the horizontal direction in FIG. 30, the slide member 67 having a C-shaped cross-sectional shape perpendicular to the longitudinal direction thereof is formed so as to be capable of being moved in the longitudinal direction of the first guide rail 64 and so as not to get out of (be separated from) the first guide rail 64 upward.

Moreover, a female screw hole is formed in an upper plate portion 67b opposite to the opening of the slide member 67 and a male screw portion of a fixing bolt 26 is fastened to the female screw hole.

Further, the lower surfaces of head portions of bolts 69 come into contact with and are engaged with the upper surface of the flange portion 64b of the first guide rail 64; male screw portions of the bolts 69 are inserted into through-holes 64c formed in the first guide rail 64, through-holes 22a of the tile 22, and through-holes 21c of the panel body 21;

and the upper surface of a plate member 65 fastened to the tip portion of the male screw portions of the bolts 69 is engaged with the lower surfaces of ribs 21b of the panel body 21. Accordingly, the first guide rail 64 is fixed to the upper surface of the tile 22 (see FIG. 30).

Even when the floor panel 60 according to this embodiment is used, it is possible to obtain the same effects as the floor panel 20 according to the first embodiment.

Figure 31:
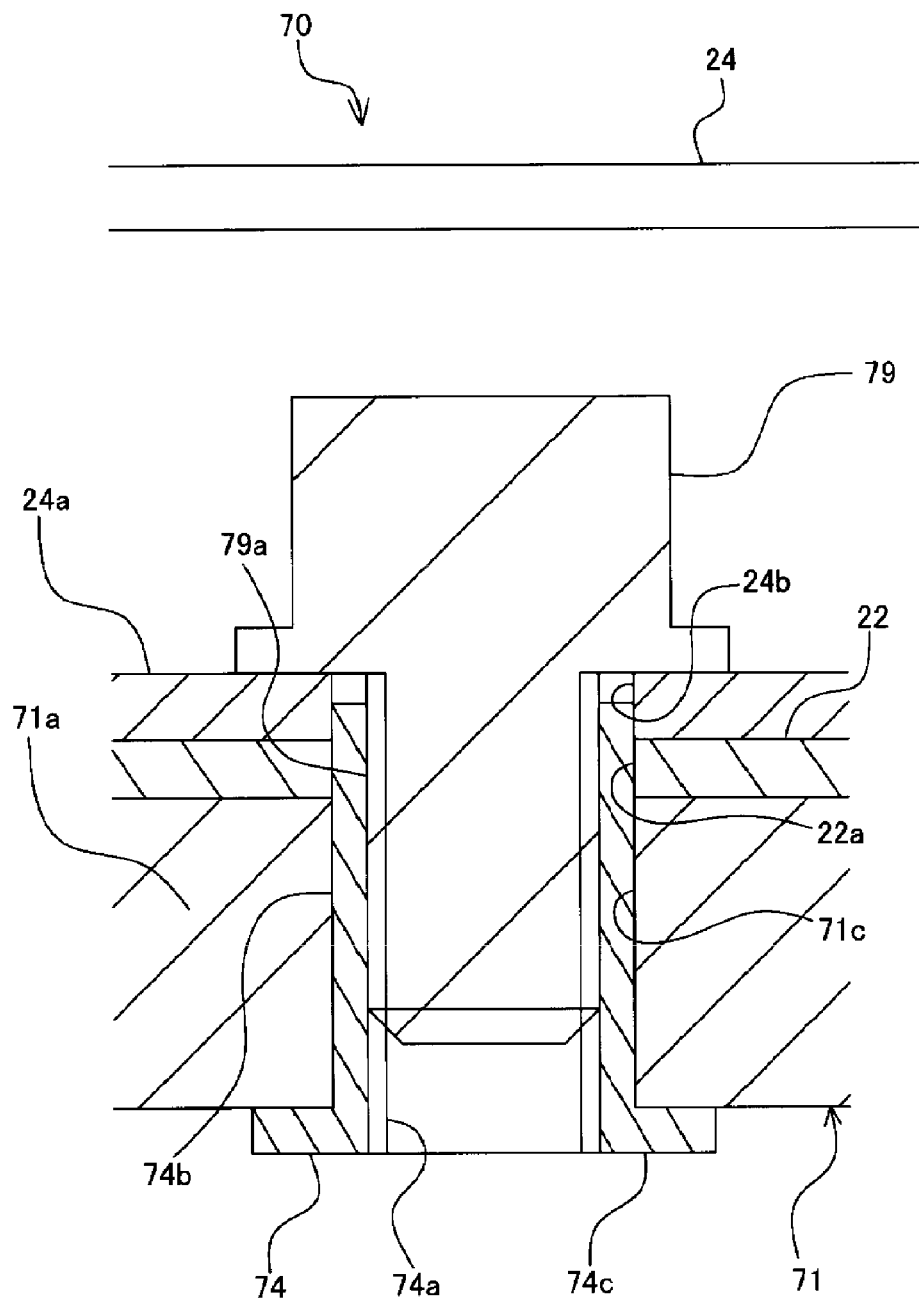
FIG. 31 is a partially enlarged cross-sectional view of a bolt 79 and a fixing member 74 of a floor panel 70 according to a seventh embodiment of the invention.

FIG. 31 is a view illustrating a floor panel 70 (double-floor member) according to a seventh embodiment of the invention.

The floor panel 70 according to this embodiment is different from the floor panel 20 according to the first embodiment in that a male screw portion 79a of a bolt 79 fixing a first guide rail 24 to the upper surface of a tile 22 is fastened to a female screw portion 74a of a fixing member 74 as illustrated in FIG. 31. Other structures of the floor panel 70 are the same as those of the floor panel 20 according to the first embodiment.

That is, in the floor panel 20 according to the first embodiment, as illustrated in FIG. 6, the male screw portion 29b of the bolt 29 is inserted into the through-hole 24b of the first guide rail 24, the through-hole 22a of the tile 22, and the through-hole 21c of the panel body 21 and the upper surface of the plate member 25 fastened to the tip portion of the male screw portion 29b of the bolt 29 is engaged with the lower surfaces of the ribs 21b of the panel body 21. As a result, the first guide rail 24 is fixed to the upper surface of the tile 22.

Meanwhile, in the floor panel 70 according to this embodiment, as illustrated in FIG. 31, the male screw portion 79a of the bolt 79 is inserted into the through-hole 24b of the first guide rail 24 and the through-hole 22a of the tile 22 and is fastened to the female screw portion 74a of a substantially cylindrical fixing member 74 fitted to a through-hole 71c of a panel body 71 from the lower side in FIG. 31. As a result, the first guide rail 24 is fixed to the upper surface of the tile 22.

As illustrated in FIG. 31, the fixing member 74 includes a cylindrical body portion 74b that extends in the axial direction thereof (a vertical direction in FIG. 31) and a flange portion 74c that protrudes outward from a lower end portion of the body portion 74b in a radial direction. Further, the female screw portion 74a is formed on the inner peripheral portion of the cylindrical body portion 74b.

Furthermore, the body portion 74b of the fixing member 74 is formed so that the outer diameter of the outer peripheral surface of the body portion 74b is substantially equal to the inner diameter of the through-hole 71c of the panel body 71. For this reason, when being inserted into the through-hole 71c of the panel body 71, the body portion 74b of the fixing member 74 is fitted to the through-hole 71c.

Moreover, the body portion 74b of the fixing member 74 is inserted into the through-hole 71c of the panel body 71 illustrated in FIG. 31 from the lower side in FIG. 31, and is inserted and fixed to the through-hole 71c of the panel body 71 by being hit from the lower side in FIG. 31 by a hammer or the like. The fixing member 74 is embedded in the through-hole 71c until the flange portion 74c comes into contact with the lower surface of a flat plate portion 71a of the panel body 71.

Further, in the floor panel 70 according to this embodiment, the thickness of the flat plate portion 71a of the panel body 71 is larger than the thickness of the flat plate portion 21a of the panel body 21 of the floor panel 20 according to the first embodiment so that the fixing member 74 having a length in the vertical direction in FIG. 31 is fitted to the through-hole 71c.

Even when the floor panel 70 according to this embodiment is used, it is possible to obtain the same effects as the floor panel 20 according to the first embodiment.

Furthermore, in the floor panel 70 according to this embodiment, it is not necessary to perform work for pressing the plate members 25 against the ribs 21b of the panel body 21 from the lower side and fastening the plate members 25 to the tip portions of the male screw portions 29b of the bolts 29 unlike in the floor panel 20 according to the first embodiment. Accordingly, it is possible to easily fix the first guide rails 24 to the upper surface of the tile 22 (see FIG. 6).

Figure 32:
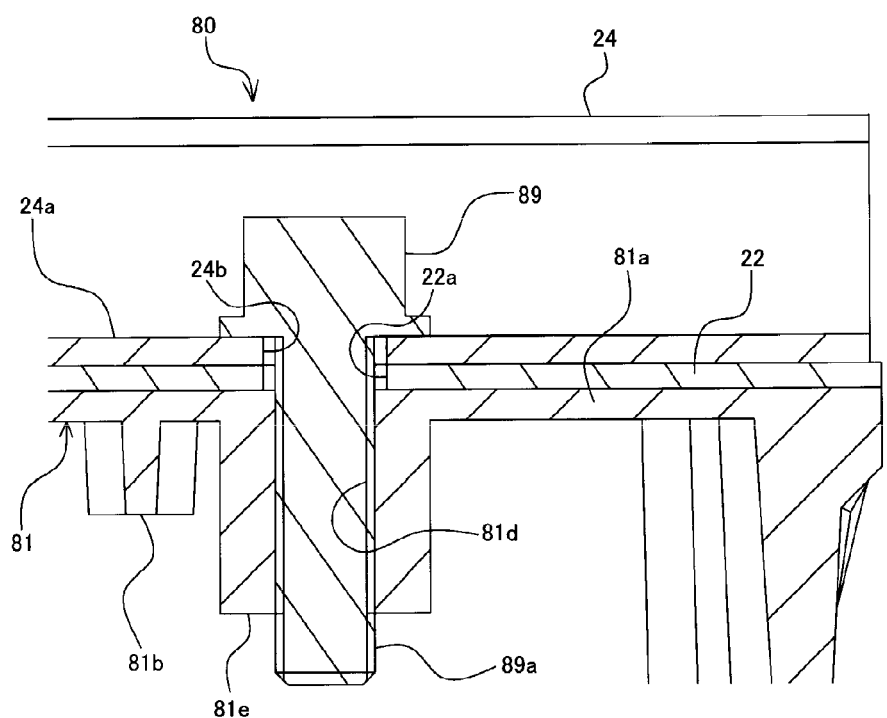
FIG. 32 is a partially enlarged cross-sectional view of a bolt 89 and a protruding portion 81e of a floor panel 80 according to an eighth embodiment of the invention.

FIG. 32 is a view illustrating a floor panel 80 (double-floor member) according to an eighth embodiment of the invention.

The floor panel 80 according to this embodiment is different from the floor panel 20 according to the first embodiment in that a male screw portion 89a of a bolt 89 fixing a first guide rail 24 to the upper surface of a tile 22 is fastened to a female screw hole 81d formed in a protruding portion 81e of a panel body 81 as illustrated in FIG. 32. Other structures of the floor panel 80 are the same as those of the floor panel 20 according to the first embodiment.

That is, in the floor panel 20 according to the first embodiment, as illustrated in FIG. 6, the male screw portion 29b of the bolt 29 is inserted into the through-hole 24b of the first guide rail 24, the through-hole 22a of the tile 22, and the through-hole 21c of the panel body 21 and the upper surface of the plate member 25 fastened to the tip portion of the male screw portion 29b of the bolt 29 is engaged with the lower surface of the ribs 21b of the panel body 21. As a result, the first guide rail 24 is fixed to the upper surface of the tile 22.

Meanwhile, in the floor panel 80 according to this embodiment, as illustrated in FIG. 32, a male screw portion 89a of a bolt 89 is inserted into the through-hole 24b of the first guide rail 24 and the through-hole 22a of the tile 22, and is fastened to the female screw hole 81d formed in a protruding portion 81e of the panel body 81. As a result, the first guide rail 24 is fixed to the upper surface of the tile 22.

The protruding portion 81e of the panel body 81 is formed near a position corresponding to the through-hole 22a of the tile 22 so as to protrude from the back surface of a flat plate portion 81a toward the lower side of the floor (a downward direction in FIG. 32), and the female screw hole 81d is formed so as to pass through the flat plate portion 81a and the protruding portion 81e in a vertical direction in FIG. 32 and so as to communicate with the through-hole 22a of the tile 22.

Even when the floor panel 80 according to this embodiment is used, it is possible to obtain the same effects as the floor panel 20 according to the first embodiment.

Further, in the floor panel 80 according to this embodiment, it is not necessary to perform work for pressing the plate members 25 against the ribs 21b of the panel body 21 from the lower side and fastening the plate members 25 to the tip portions of the male screw portions 29b of the bolts 29 unlike in the floor panel 20 according to the first embodiment. Accordingly, it is possible to easily fix the first guide rails 24 to the upper surface of the tile 22 (see FIG. 6).

Figure 33:
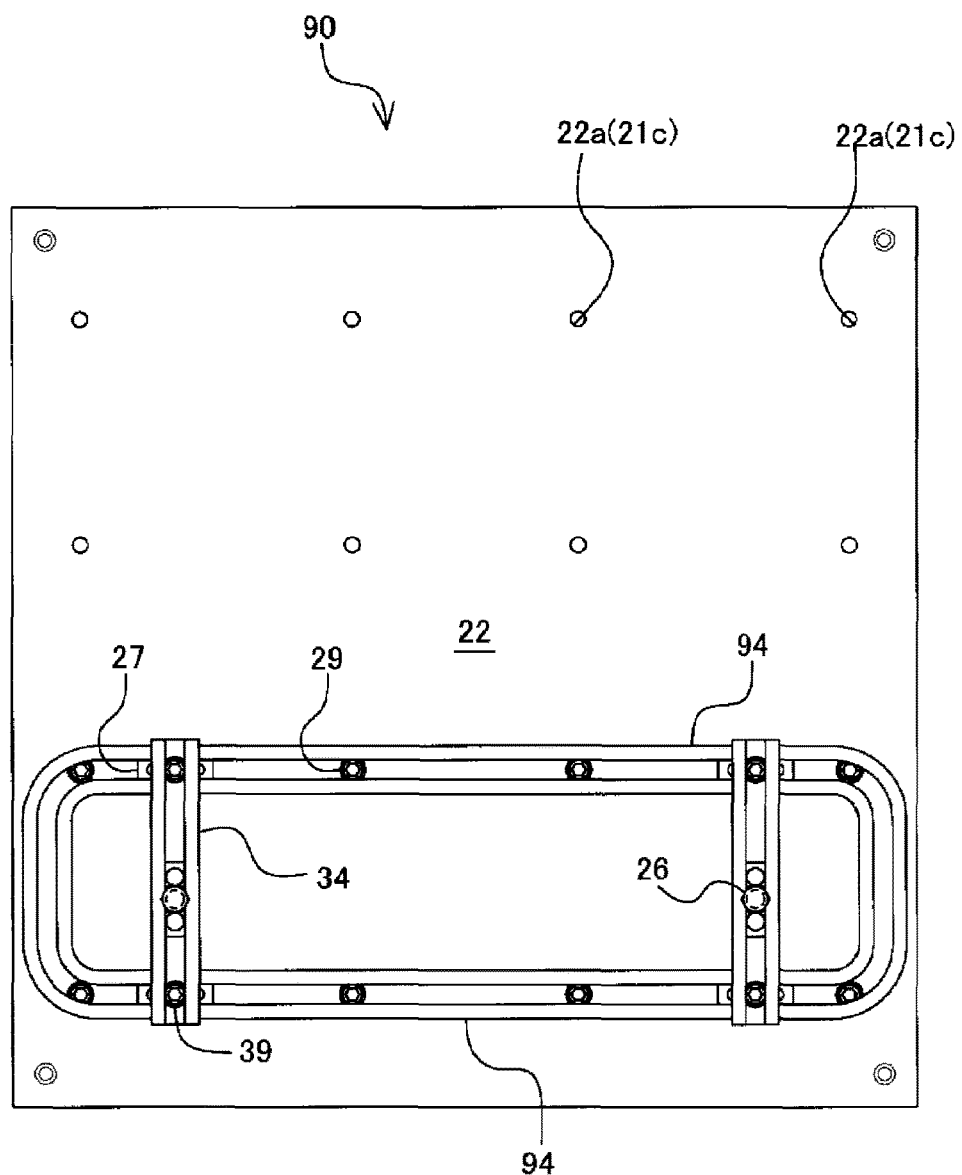
FIG. 33 is a top view of a floor panel 90 according to a ninth embodiment of the invention.

FIG. 33 is a view illustrating a floor panel 90 (double-floor member) according to a ninth embodiment of the invention.

The floor panel 90 according to this embodiment is different from the floor panel 20 according to the first embodiment in that a first guide rail 94 disposed on the upper surface of the floor panel 90 is formed in the shape of a loop so that both end portions of the two first guide rails 24 of the floor panel 20 according to the first embodiment are connected to each other as illustrated in FIG. 33. Other structures of the floor panel 90 are the same as those of the floor panel 20 according to the first embodiment.

Even when the floor panel 90 according to this embodiment is used, it is possible to obtain the same effects as the floor panel 20 according to the first embodiment.

Figure 34:
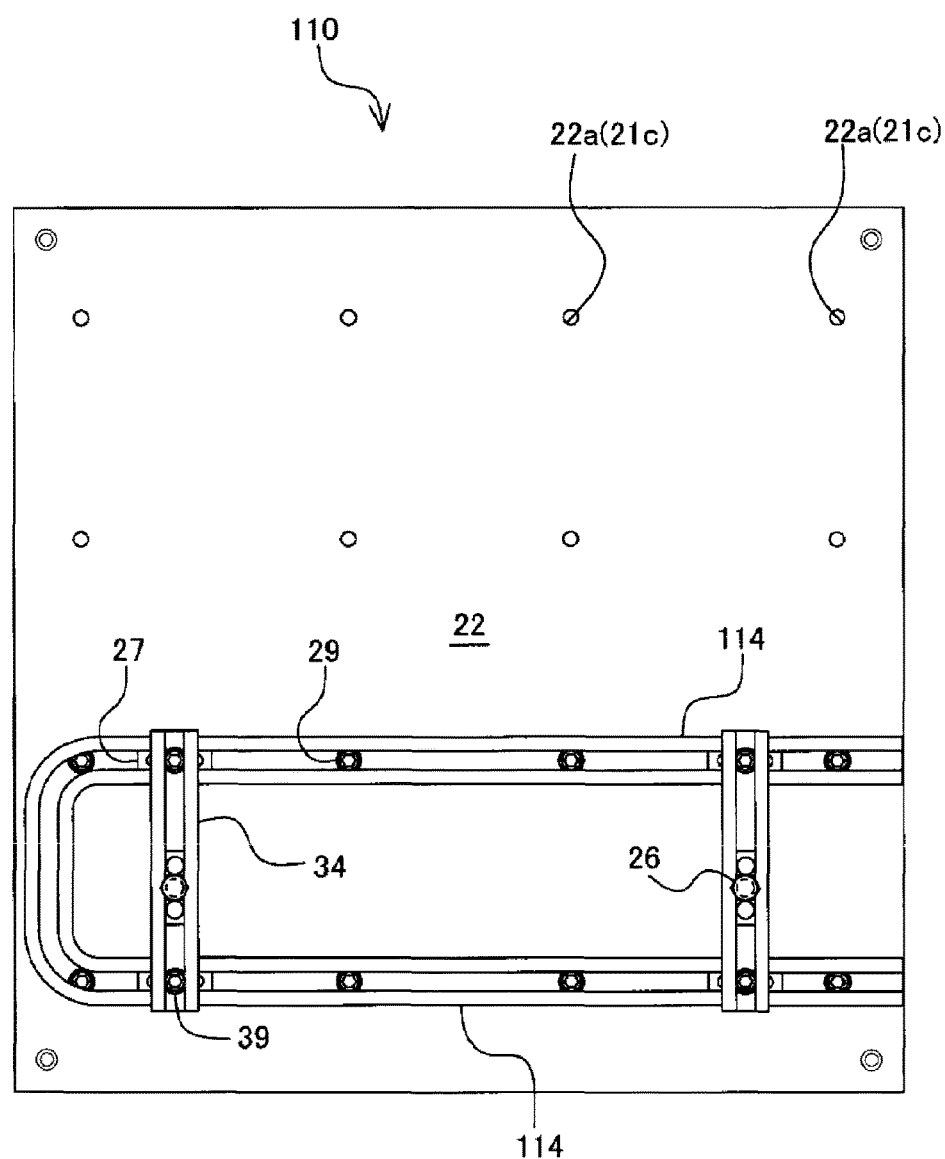
FIG. 34 is a top view of a floor panel 110 according to a tenth embodiment of the invention.
Figure 35:
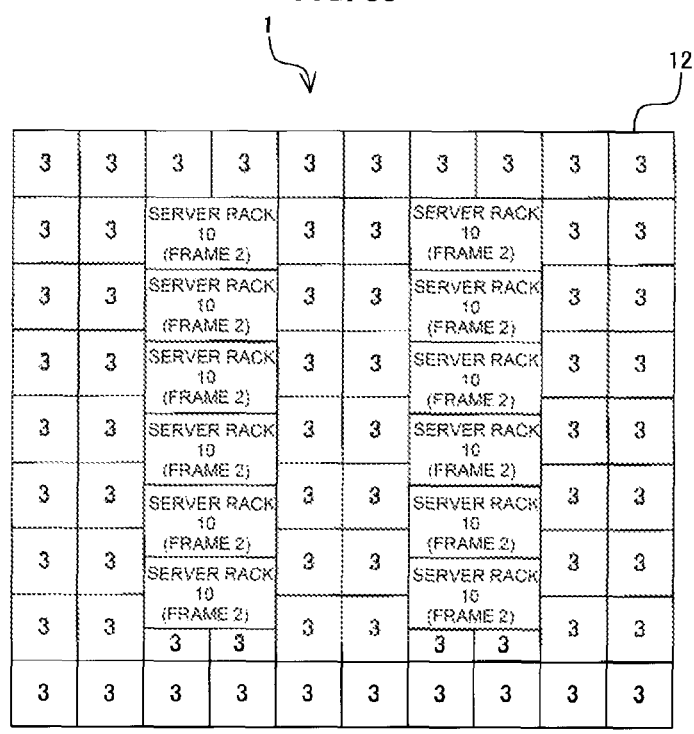
FIG. 35 is a schematic plan view of a data center 1 in which floor panels 3 in the related art are used.

FIG. 34 is a view illustrating a floor panel 110 (double-floor member) according to a tenth embodiment of the invention.

The floor panel 110 according to this embodiment is different from the floor panel 20 according to the first embodiment in that a first guide rail 114 disposed on the upper surface of the floor panel 110 is formed in a U shape so that left end portions of the two first guide rails 24 of the floor panel 20 according to the first embodiment in FIG. 1 are connected to each other as illustrated in FIG. 34. Other structures of the floor panel 110 are the same as those of the floor panel 20 according to the first embodiment.

Even when the floor panel 110 according to this embodiment is used, it is possible to obtain the same effects as the floor panel 20 according to the first embodiment.

Meanwhile, the invention is not limited to only the first to tenth embodiments, and the floor panel can be modified in various ways in a range in which an object of the invention can be achieved.

For example, 16 through-holes 21c of the panel body 21 and 16 through-holes 22a of the tile 22 are formed in the floor panels 20, 30, 90, and 110 according to the first, second, ninth, and tenth embodiments. However, the number of the through-holes is not limited to 16 and, for example, may be larger than 16 or may be smaller than 16.

Further, the fixing bolts 26 and the slide members 27 and 37 are fastened to each other in the floor panels 20 and 30 according to the first and second embodiments, so that the server racks 100 are fixed to the floor panels 20 and 30. However, a method of fixing the server racks 100 does not need to be limited to this fixing (connecting) method and other fixing methods using fixing members other than the fixing bolts 26 may be used.

Furthermore, in the floor panels 20 and 30 according to the first and second embodiments, each of the first and second guide rails 24 and 34 is linearly formed so that the longitudinal direction of each of the first and second guide rails extends in one direction. However, the shape of each of the first and second guide rails 24 and 34 does not need to be limited to this shape, and each of the first and second guide rails 24 and 34 may include a curved portion in the longitudinal direction thereof.

Moreover, in the floor panels 20 and 30 according to the first and second embodiments, each of the first and second guide rails 24 and 34 is disposed so that the longitudinal direction of each of the first and second guide rails 24 and 34 is substantially parallel to the side of the tile 22. However, each of the first and second guide rails 24 and 34 may be disposed so that the longitudinal direction of each of the first and second guide rails 24 and 34 is inclined with respect to the side of the tile 22.

Further, in the floor panels 20 and 30 according to the first and second embodiments, the server racks 100 are fixed to the floor panels 20 and 30. However, an object to be fixed to the floor panel does not need to be limited to the server rack, and may be, for example, other cases or members.

Furthermore, in the floor panels 20 and 30 according to the first and second embodiments, the first guide rails 24 are fixed to the panel body 21, which is a die-cast product using an aluminum alloy as a material thereof, or the like. An object to which the first guide rails 24 are fixed does not need to be limited to the panel body 21 or the like, and other types of panel bodies may be used as the object to which the first guide rails are fixed.

Figure 36:
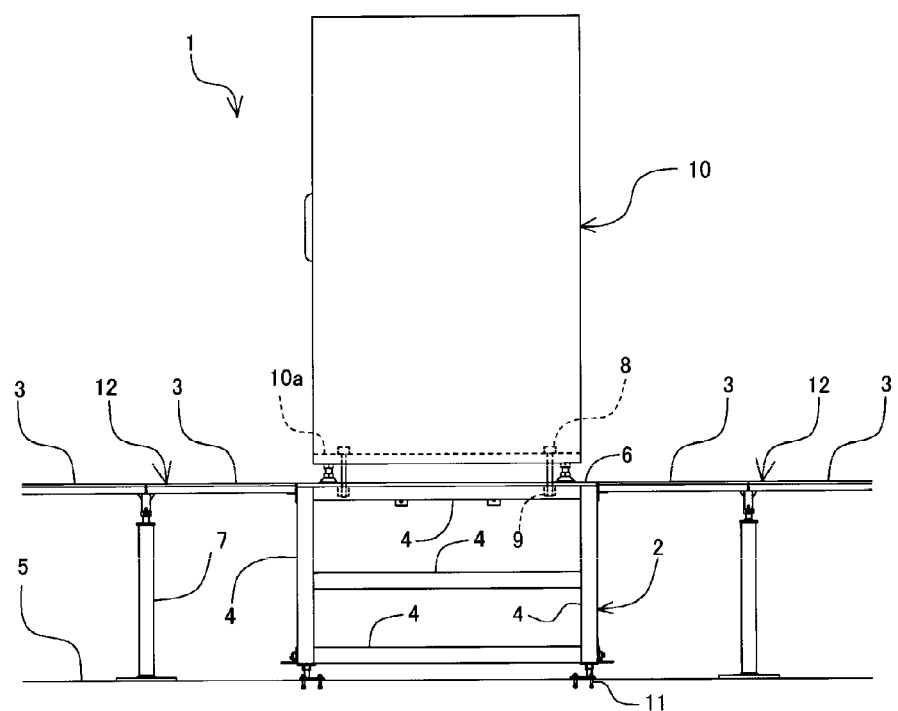
FIG. 36 is a schematic side view illustrating a state in which a server rack 10 is placed on a frame 2 in the data center 1 in which the floor panels 3 in the related art are used.
Figure 37:
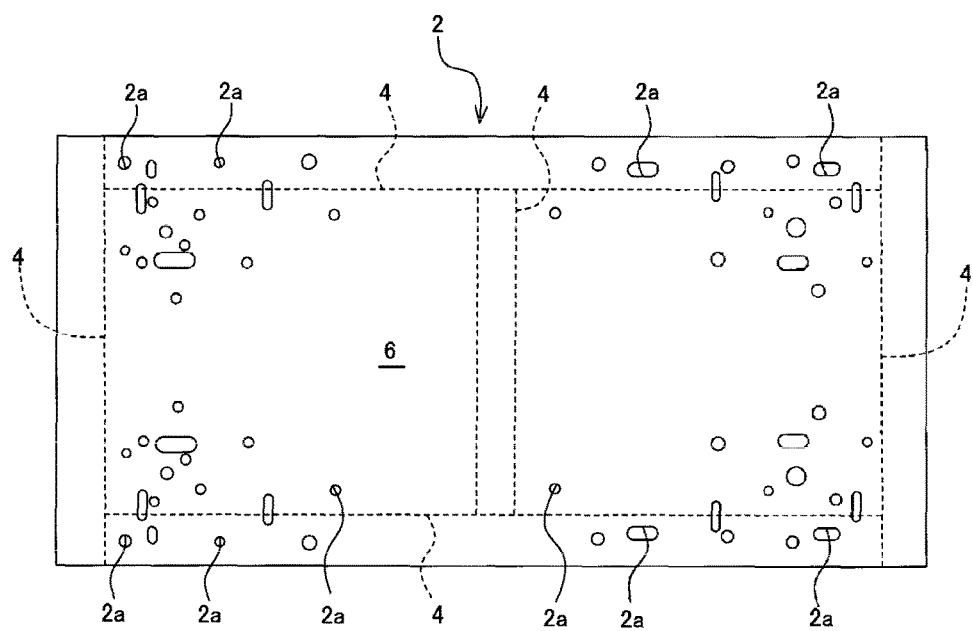
FIG. 37 is a schematic top view of the frame 2 illustrated in FIG. 36.

Moreover, the first guide rails 24, the slide members 27, the second guide rails 34, and the slide members 37 are disposed on the panel body 21 in the floor panels 20 and 30 according to the first and second embodiments, but may be disposed on the frame 2 (double-floor member) used in the data center 1 in the related art (see FIG. 36).

Even when the frame 2 is used instead of the floor panels 20 and 30 according to the first and second embodiments as described above, it is possible to obtain the same effects as the floor panels 20 and 30 according to the first and second embodiments.

Further, in the floor panels 50 and 55 according to the fourth and fifth embodiments, the groove rails 51c are formed on the upper surface of the floor panels 50 and 55 and the slide members 27, the second guide rails 34, and the slide members 37 are disposed on the panel body 51. The groove rails 51c may be formed on the upper surface of the frame 2 (double-floor member) used in the data center 1 in the related art, and the slide members 27, the second guide rails 34, and the slide members 37 may be disposed on the frame 2 (see FIG. 36).

Even when the frame 2 is used instead of the floor panels 50 and 55 according to the fourth and fifth embodiments as described above, it is possible to obtain the same effects as the floor panels 50 and 55 according to the fourth and fifth embodiments.

Furthermore, the two first guide rails 24 are fixed to the upper surface of the floor panel 20 according to the first embodiment. However, the number of the first guide rails 24 fixed to the upper surface of the floor panel 20 does not need to be limited to two, and one first guide rails 24 may be fixed or three or more first guide rails 24 may be fixed.

Moreover, the tile 22, such as a vinyl chloride-based P-tile or a HPL (high-pressure laminate) tile, is attached to the upper surface of the flat plate portion 21a of the panel body 21. However, the tile 22 does not need to be limited to these hard tiles, and for example, a soft sheet, such as a vinyl chloride sheet, may be attached or a tile carpet may be attached. Further, nothing may be attached to the upper surface of the flat plate portion 21a of the panel body 21.

Further, in the floor panel 20 according to the first embodiment, each of the opening shape of the through-hole 21c of the panel body 21 and the opening shape of the through-hole 22a of the tile 22 is a circular shape as illustrated in FIG. 1. However, long holes having a length in the vertical direction in FIG. 1 may be formed in the range of positions where the ribs 21b are not formed on the back surface of the flat plate portion 21a of the panel body 21.

When each of the opening shape of the through-hole 21c of the panel body 21 and the opening shape of the through-hole 22a of the tile 22 is formed into the shape of a long hole having a length in the vertical direction in FIG. 1, the first guide rail 24 can be disposed so as to be inclined with respect to the side of the tile 22. When the first guide rails 24 are fixed to the upper surface of the tile 22, construction is easy.

Furthermore, in the floor panel 40 according to the third embodiment, as illustrated in FIG. 27, each of the first guide rails 44 is formed so as to have a length of about ⅓ of the length of the first guide rail 24 of the floor panel 20 according to the first embodiment. However, the length of the first guide rail 44 may be further formed to be short so that the first guide rail is locally disposed.

Moreover, in the floor panels 20 and 30 according to the first and second embodiments, as illustrated in FIGS. 1 and 14, the male screw portions 29b of the bolts 29 are inserted into the through-holes 22a and 21c to fix the first guide rails 24. However, through-holes 22a and 21c that are formed at positions where the first guide rails 24 are not disposed (the through-holes 22a and 21c that are not used to fix the first guide rails 24) are not closed.

For this reason, in the floor panels 20 and 30 according to the first and second embodiments, the through-holes 22a and 21c that are not used to fix the first guide rails 24 (the through-holes 22a and 21c formed side by side along two upper rows in FIGS. 1 and 14 that extend in the horizontal direction in FIGS. 1 and 14) may be closed by, for example, caps or the like.

It is possible to prevent air from leaking from the upper surfaces of the floor panels 20 and 30 to the lower surfaces thereof and from the lower surfaces thereof to the upper surfaces thereof through the through-holes 22a and 21c by closing the through-holes 22a and 21c, which are not used to fix the first guide rails 24, by caps or the like as described above.

EXPLANATIONS OF LETTERS OR NUMERALS

1 DATA CENTER
2 FRAME
2a THROUGH-HOLE
3 FLOOR PANEL
4 ANGLE MEMBER
5 FOUNDATION FLOOR FACE
6 UPPER PLATE MEMBER
7 SUPPORT LEG
8 FIXING BOLT
9 FIXING NUT
10 SERVER RACK
10a BOTTOM PLATE PORTION
11 ANCHOR BOLT
12 FREE ACCESS FLOOR
20 FLOOR PANEL
20a THROUGH-HOLE
21 PANEL BODY
21a FLAT PLATE PORTION
21b RIB
21c THROUGH-HOLE
22 TILE
22a THROUGH-HOLE
24 FIRST GUIDE RAIL
24a BOTTOM PLATE PORTION
24b THROUGH-HOLE
25 PLATE MEMBER
25a FEMALE SCREW HOLE
26 FIXING BOLT
26a HEAD PORTION
26b MALE SCREW PORTION
27 SLIDE MEMBER
27a UPPER PLATE PORTION
27b LOWER SURFACE
27c FEMALE SCREW HOLE
29 BOLT
29a HEAD PORTION
29b MALE SCREW PORTION
30 FLOOR PANEL
30a THROUGH-HOLE
34 SECOND GUIDE RAIL
34a BOTTOM PLATE PORTION
34b THROUGH-HOLE
37 SLIDE MEMBER
37a UPPER PLATE PORTION
37b LOWER SURFACE
37c FEMALE SCREW HOLE
39 BOLT
39a HEAD PORTION
40 FLOOR PANEL
44 FIRST GUIDE RAIL
50 FLOOR PANEL
51a FLAT PLATE PORTION
51b RIB
51c GROOVE RAIL
55 FLOOR PANEL
60 FLOOR PANEL
64 FIRST GUIDE RAIL
64a FLANGE PORTION
64b FLANGE PORTION
64c THROUGH-HOLE
65 PLATE MEMBER
67 SLIDE MEMBER
67a LOWER PLATE PORTION
67b UPPER PLATE PORTION
69 BOLT
70 FLOOR PANEL
71 PANEL BODY
71a FLAT PLATE PORTION
71c THROUGH-HOLE
74 FIXING MEMBER
74a FEMALE SCREW PORTION
74b BODY PORTION
79 BOLT
79a MALE SCREW PORTION
80 FLOOR PANEL
81 PANEL BODY
81a FLAT PLATE PORTION
81b RIB
81d FEMALE SCREW HOLE
81e PROTRUDING PORTION
89 BOLT
89a MALE SCREW PORTION
90 FLOOR PANEL
94 FIRST GUIDE RAIL
100 SERVER RACK
100a LEG PART
100b BOTTOM PLATE PORTION
100c THROUGH-HOLE
109 SUPPORT LEG
110 FLOOR PANEL
114 FIRST GUIDE RAIL
115 ANCHOR BOLT
L LENGTH

The invention claimed is:

1. A double-floor member comprising:
at least one floor panel comprising an upper surface configured to be substantially flat and square shaped forming a horizontal floor face held horizontally at a predetermined height from a foundation floor face, said at least one floor panel being arranged side by side on which at least one case is adapted to be placed;
at least one first guide rail that is directly in contact with and fixed to the upper surface of said at least one floor panel, said first guide rail being extended in a horizontal direction along the upper surface of the floor panel; and
at least one first connecting member that is movable in a longitudinal direction of said first guide rail and is engaged with said first guide rail so as not to be separated upward from said first guide rail;

wherein said at least one first connecting member is configured to be connected to said at least one case by at least one fixing bolt so that the first guide rail and the first connecting member are not directly in contact with the case.

2. The double-floor member according to claim 1, wherein at least one hole is formed in said first connecting member so that said first connecting member is connected to the case by the fixing bolt.

3. The double-floor member according to claim 1, wherein said first guide rail is fixed to the upper surface of said floor panel so that a fixing position of the first guide rail is adjustable on the upper face.

4. The double-floor member according to claim 3, wherein a plurality of through-holes that pass through the floor panel in a thickness direction are provided, and
wherein the first guide rail is fixed to the upper surface of the floor panel through said at least one through-holes.

5. The double-floor member according to claim 1, wherein a plurality of lattice shaped ribs are formed on a back surface of the floor panel, protruding toward a lower side of the floor panel, and
wherein a plurality of flat plate members are provided at tip portions of longest ribs among the plurality of ribs, which protrude from the back surface of the floor panel toward the lower side of the floor panel so that the upper surfaces of the flat plate members come into contact with the tip portions of the longest ribs.

6. The double-floor member according to claim 1, wherein a plurality of through-hole are provided that pass through the floor panel in a thickness direction,
wherein a fixing member including a cylindrical body portion and a flange portion that protrudes outward from a lower end portion of the cylindrical body portion in a radial direction is provided, and
wherein the cylindrical body portion of the fixing member is configured to be inserted into the through-hole provided in the floor panel from the lower side of the floor panel and fixed to the through-hole.

7. A double-floor member, comprising:
at least one floor panel comprising an upper surface configured to be substantially flat and square shaped forming a horizontal floor face held horizontally at a predetermined height from a foundation floor face, said at least one floor panel being arranged side by side on which at least one case is adapted to be placed;
at least one first guide rail that is directly in contact with and fixed to the upper surface of said at least one floor panel, said first guide rail being extended in a horizontal direction along the upper surface of the floor panel;
at least one first connecting member that is movable in a longitudinal direction of said first guide rail and is engaged with said first guide rail so as not to be separated upward from said first guide rail;
at least one second guide rail that is disposed so as to be bridged between said at least one first guide rail and is connected to said first connecting member engaged with said first guide rail, respectively; and
at least one second connecting member that is movable in the longitudinal direction of said second guide rail and is engaged with said second guide rail so as not to be separated upward from said second guide rail;
wherein said at least one second connecting member is configured to be connected to said at least one case by at least one fixing bolt so that the second guide rail and the second connecting member are not directly in contact with the case.

8. The double-floor member according to claim 7, wherein at least one hole is formed in said second connecting member so that said second connecting member is connected to the case by the fixing bolt.

9. The double-floor member according to claim 7, wherein at least two first guide rails are disposed at predetermined intervals on the upper surface of the floor panel to extend in the horizontal direction in parallel with each other, and
wherein said at least one second guide rail is disposed so as to be bridged between said at least two first guide rail in a direction orthogonal to the first guide rails.

10. The double-floor member according to claim 7, wherein said at least one second guide rail is disposed so as to be bridged between one first guide rail provided on the upper surface of one floor panel and other first guide rail provided on the upper surface of other floor panel that is adjacent to the one floor panel.

11. A double-floor member comprising:
at least one floor panel comprising an upper surface configured to be substantially flat and square shaped forming a horizontal floor face held horizontally at a predetermined height from a foundation floor face, said at least one floor panel being arranged side by side on which at least one case is adapted to be placed;
at least one groove rail that is formed so as to be recessed from the upper surface toward a lower side of said at least one floor panel, said groove rail being extended in a horizontal direction along the upper surface of the floor panel; and
at least one first connecting member that is movable in the longitudinal direction of said groove rail and is engaged with said groove rail so as not to be separated upward from said groove rail;
wherein said at least one first connecting member is configured to be connected to the at least one case by at least one fixing bolt so that the first connecting member is not directly in contact with the case.

12. The double-floor member according to claim 11, wherein at least one hole is formed in said first connecting member so that said first connecting member is connected to the case by the fixing bolt.

13. A double-floor member, comprising:
at least one floor panel comprising an upper surface configured to be substantially flat and square shaped forming a horizontal floor face held horizontally at a predetermined height from a foundation floor face, said at least one floor panel being arranged side by side on which at least one case is adapted to be placed;
at least one groove rail that is formed so as to be recessed from the upper surface toward a lower side of said at least one floor panel, said groove rail being extended in a horizontal direction along the upper surface of the floor panel;
at least one first connecting member that is movable in the longitudinal direction of said groove rail and is engaged with said groove rail so as not to be separated upward from said groove rail,
at least one second guide rail that is disposed so as to be bridged between said at least one groove rail and is connected to said first connecting member engaged with said groove rail, respectively; and
at least one second connecting member that is movable in the longitudinal direction of said second guide rail and is engaged with said second guide rail so as not to be separated upward from said second guide rail;

wherein said at least one second connecting member is configured to be connected to said at least one case by at least one fixing bolt so that the second guide rail and the second connecting member are not directly in contact with the case.

14. The double-floor member according to claim 13, wherein at least one hole is formed in said second connecting member so that said second connecting member is connected to the case by the fixing bolt.

15. The double-floor member according to claim 13, wherein at least two groove rails are disposed at predetermined intervals on the upper surface of the floor panel to extend in the horizontal direction in parallel with each other, and wherein said at least one second guide rail is disposed so as to be bridged between said at least two groove rails in a direction orthogonal to the groove rails.

* * * * *